(12) United States Patent
Daubenspeck et al.

(10) Patent No.: US 8,242,012 B2
(45) Date of Patent: Aug. 14, 2012

(54) INTEGRATED CIRCUIT STRUCTURE INCORPORATING A CONDUCTOR LAYER WITH BOTH TOP SURFACE AND SIDEWALL PASSIVATION AND A METHOD OF FORMING THE INTEGRATED CIRCUIT STRUCTURE

(75) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US); Timothy D. Sullivan, Franklin Lakes, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/845,065

(22) Filed: Jul. 28, 2010

(65) Prior Publication Data

US 2012/0025383 A1   Feb. 2, 2012

(51) Int. Cl.
  *H01L 21/44* (2006.01)
(52) U.S. Cl. ........ 438/614; 438/597; 438/612; 438/652; 257/750; 257/762; 257/E21.59
(58) Field of Classification Search .................. 438/597, 438/612–614, 652, 653; 257/750, 751
  See application file for complete search history.

(56) References Cited

U.S. PATENT DOCUMENTS

| | | | |
|---|---|---|---|
| 5,750,430 A * | 5/1998 | Son | 438/303 |
| 5,858,869 A | 1/1999 | Chen et al. | |
| 6,277,745 B1 | 8/2001 | Liu et al. | |
| 6,358,842 B1 | 3/2002 | Zhou et al. | |
| 6,482,717 B1 * | 11/2002 | Hahn | 438/429 |
| 6,551,856 B1 | 4/2003 | Lee | |
| 6,552,382 B1 * | 4/2003 | Wu | 257/305 |
| 6,590,295 B1 * | 7/2003 | Liao et al. | 257/781 |
| 6,784,544 B1 * | 8/2004 | Farnworth | 257/751 |
| 6,806,576 B2 | 10/2004 | Ireland et al. | |
| 6,966,997 B1 | 11/2005 | Inganas et al. | |
| 7,169,691 B2 | 1/2007 | Doan | |
| 7,439,169 B2 * | 10/2008 | Watkins | 438/612 |

(Continued)

OTHER PUBLICATIONS

Ko, et al., "Development of Three-Dimensional Memory Die Stack Packages Using Polymer Insulated Sidewall Techniques," IEEE Transactions on Advanced Packaging, vol. 23, No. 2, May 2000, pp. 252-256.

*Primary Examiner* — Leonard Chang
(74) *Attorney, Agent, or Firm* — Gibb & Riley, LLC; David A. Cain, Esq.

(57) ABSTRACT

Disclosed are embodiments of a structure having a metal layer with top surface and sidewall passivation and a method of forming the structure. In one embodiment, a metal layer is electroplated onto a portion of a seed layer at the bottom of a trench. Then, the sidewalls of the metal layer are exposed and, for passivation, a second metal layer is electroplated onto the top surface and sidewalls of the metal layer. In another embodiment, a trench is formed in a dielectric layer. A seed layer is formed over the dielectric layer, lining the trench. A metal layer is electroplated onto the portion of the seed layer within the trench and a second metal layer is electroplated onto the top surface of the metal layer. Thus, in this case, passivation of the top surface and sidewalls of the metal layer is provided by the second metal layer and the dielectric layer, respectively.

9 Claims, 20 Drawing Sheets

U.S. PATENT DOCUMENTS

| | | |
|---|---|---|
| 7,446,047 B2 | 11/2008 | Tsai et al. |
| 2006/0019480 A1* | 1/2006 | Cheng et al. ............ 438/612 |
| 2006/0151801 A1* | 7/2006 | Doan et al. ............... 257/99 |
| 2006/0199306 A1 | 9/2006 | Tsai et al. |
| 2008/0057709 A1 | 3/2008 | Vasilev |
| 2008/0096378 A1* | 4/2008 | Kim et al. ............... 438/597 |
| 2008/0230877 A1 | 9/2008 | Chung et al. |
| 2009/0017576 A1 | 1/2009 | Borthakur et al. |
| 2009/0026566 A1 | 1/2009 | Oliver et al. |
| 2009/0146316 A1 | 6/2009 | Jadhav et al. |
| 2009/0166848 A1 | 7/2009 | Berghof et al. |
| 2009/0315180 A1 | 12/2009 | Lee |
| 2010/0032835 A1 | 2/2010 | Daubenspeck et al. |

* cited by examiner

INTEGRATED CIRCUIT STRUCTURE INCORPORATING A CONDUCTOR LAYER WITH BOTH TOP SURFACE AND SIDEWALL PASSIVATION AND A METHOD OF FORMING THE INTEGRATED CIRCUIT STRUCTURE

BACKGROUND

1. Field of the Invention

The embodiments relate to integrated circuits and, more specifically, to an integrated circuit structure incorporating a conductor layer, such as a redistribution layer, with both top surface and sidewall passivation and a method of forming the integrated circuit structure.

2. Description of the Related Art

During back end of the line (BEOL) processing of integrated circuit structures, redistribution layers may be formed to provide low resistance, on-chip interconnects. Such redistribution layers may also be formed to allow integrated circuit structures, which were originally designed for wirebonding, to be used in flip-chip packages. Unfortunately, current low-cost processing techniques for forming redistribution layers suffer from poor dimensional control due to insufficient sidewall passivation. Poor dimensional control, in turn, results in reduced reliability, particularly with continued size-scaling of integrated circuit structures. Therefore, there is a need in the art for a method of forming an integrated circuit structure that incorporates a redistribution layer with both top surface and sidewall passivation to ensure greater dimensional control and, thereby greater reliability.

SUMMARY

In view of the foregoing, disclosed herein are embodiments of an integrated circuit structure that incorporates a metal layer (e.g., a redistribution layer) with both top surface and sidewall passivation and a method of forming the integrated circuit structure. In one embodiment of the structure, top surface and sidewall passivation of a first metal layer can be provided by a second metal layer. To form such a structure, a first metal layer can be selectively electroplated onto an exposed portion of a seed layer at the bottom surface of a trench, which extends through a mask layer. Then, the sidewalls of the first metal layer within the trench can be exposed (e.g., either by removing spacers within the trench or by shrinking the mask layer). After the sidewalls of the first metal layer are exposed, a second metal layer different from the first can be selectively electroplated onto both the top surface and sidewalls of the first metal layer. In another embodiment of the structure, sidewall passivation of a first metal layer can be provided by a dielectric layer and top surface passivation of that same first metal layer can be provided by a second metal layer. To form such a structure, a trench can be formed in a dielectric layer. Then, a seed layer can be formed over the dielectric layer and lining the trench. Next, a mask layer can be with an opening aligned above the trench (e.g., by stamping on a patterned organic mask layer). Then, a first metal layer can be selectively electroplated onto the exposed portion of the seed layer within the trench and a second metal layer different from the first can be electroplated onto the top surface of the first metal layer. Top surface and sidewall passivation of the first metal layer ensures that the first metal layer is protected during subsequent processing (e.g., an etch process to remove excess seed material). Thus, the embodiments provide greater dimensional control and, thereby greater reliability.

More particularly, one embodiment of an integrated circuit structure that incorporates a metal layer (e.g., a redistribution layer) with both top surface and sidewall passivation can comprise a seed layer having a first portion (e.g., a center portion) and second portions (e.g., edge portions). The first portion can be positioned laterally between the second portions. A first metal layer, having a top surface and sidewalls, can be positioned on the first portion only. Thus, the second portions can extend laterally beyond the sidewalls of the first metal layer. A second metal layer, which comprises a different metal material than the first metal layer, can be positioned on the second portions of the seed layer and further on the sidewalls and top surface of the first metal layer. In this case, the second metal layer passivates the top surface and sidewalls of the first metal layer.

One embodiment of a method of forming this integrated circuit structure can comprise forming a seed layer. A mask layer can be formed on the seed layer and a trench, which extends through the mask layer to the seed layer, can be formed. Next, spacers can be formed within the trench on the seed layer and positioned laterally adjacent to the sidewalls of the trench (i.e., the first sidewalls) such that a first portion of the seed layer remains exposed within the trench. Once the spacers are formed, a first metal layer can be formed on the exposed first portion of the seed layer. After the first metal layer is formed, the spacers can be removed so as to expose the sidewalls of the first metal layer (i.e., the second sidewalls) and so as to also expose second portions of the seed layer adjacent to the sidewalls of the first metal layer. Next, a second metal layer, which comprises a different metal material than the first metal layer, can be formed on the exposed second portions of the seed layer and on the exposed sidewalls and top surface of the first metal layer. After the second metal layer is formed, the mask layer can be removed so as to expose third portions of the seed layer adjacent to the second portions and an etch process can be performed to remove these third portions.

Another embodiment of a method of forming this integrated circuit structure similarly comprises forming a seed layer and forming a mask layer on the seed layer. In this case, the mask layer specifically comprises a photosensitive polyimide material. Next, a trench, which extends through the mask layer and exposes a first portion of the seed layer, can be formed. Then, a first metal layer can be formed on the exposed first portion of the seed layer within the trench. After the first metal layer is formed, the photosensitive polyimide material can be cured so that the mask layer shrinks in size, thereby exposing the sidewalls of the first metal layer and also exposing second portions of the seed layer adjacent to the sidewalls of the first metal layer. Next, a second metal layer, which comprises a different metal material than the first metal layer, can be formed on the exposed second portions of the seed layer and on the exposed sidewalls and top surface of the first metal layer. After the second metal layer is formed, the mask layer can be removed so as to expose third portions of the seed layer adjacent to the second portions and an etch process can be performed to remove these third portions.

Another embodiment of an integrated circuit structure that incorporates a metal layer (e.g., a redistribution layer) with both top surface and sidewall passivation can comprise a first dielectric layer and a second dielectric layer on the first dielectric layer. A trench can extend vertically through the second dielectric layer to the first dielectric layer and a seed layer can line the bottom surface and sidewalls of the trench. A first metal layer can be positioned on the seed layer within the trench and a second metal layer, which comprises a different metal material than the first metal layer, can be positioned on the top surface of the first metal layer. In this case, the second metal layer passivates the top surface and the second dielectric layer passivates the sidewalls of the first metal layer, respectively.

An embodiment of a method of forming this integrated circuit structure can comprise forming a first dielectric layer and further forming a second dielectric layer on the first dielectric layer. Next, a trench, which extends vertically through the second dielectric layer to the first dielectric layer, can be formed. Then, a seed layer can be formed on the second dielectric layer and lining the trench. A patterned mask layer can be formed on the seed layer (e.g., by patterning an organic mask layer and stamping it onto the seed layer). This patterned mask layer can specifically be formed with an opening aligned above the trench so that a first portion of the seed layer is exposed. Next, a first metal layer can be formed on the exposed first portion of the seed layer within the trench and a second metal layer, which comprises a different metal material than the first metal layer, can be formed on the top surface of the first metal layer. Once the second metal layer is formed, the mask layer can be removed so as to expose second portions of the seed layer. Then, an etch process can be performed so as to remove these second portions.

BRIEF DESCRIPTION OF THE SEVERAL VIEWS OF THE DRAWINGS

The embodiments of the invention will be better understood from the following detailed description with reference to the following figures, which are not necessarily drawn to scale and in which.

DETAILED DESCRIPTION

The embodiments of the invention and the various features and advantageous details thereof are explained more fully with reference to the non-limiting embodiments that are illustrated in the accompanying drawings and detailed in the following description.

During back end of the line (BEOL) processing of integrated circuit structures, redistribution layers may be formed to provide low resistance, on-chip interconnects. Such redistribution layers may also be formed to allow integrated circuit structures, which were originally designed for wirebonding, to be used in flip-chip packages. That is, as discussed in detail in U.S. Patent Application Publication No. 2009/0146316 of Jadhav et al., filed on Dec. 5, 2007, published on Jun. 11, 2009, assigned to International Business Machines Corporation of Armonk, N.Y., and incorporated herein by reference, in a flip-chip package an integrated circuit structure (i.e., a chip) is typically mounted on a chip carrier by an array of controlled collapsed chip connections (i.e., C4 connections). The formation of such C4 connections usually involves the formation of solder balls on conductive pads on the active surface of an integrated circuit chip, thereby creating an array of solder bumps. The array of solder bumps on the integrated chip is aligned with the array of solder paste filled openings on the chip carrier. Next, the integrated circuit chip and chip carrier are pressed together and a reflow process is performed to create the solder joints (i.e., the C4 connections) that both electrically and mechanically connect the integrated circuit chip to the chip carrier. However, if the integrated circuit structure was originally designed for wirebonding, conductive pad density (i.e., the number of conductive pads within defined surface area) must be considered before the integrated circuit structure can be incorporated into a flip-chip package. Specifically, the conductive pad density on integrated circuits structures designed for wirebonding is typically greater than the conductive pad density on integrated circuit structures designed for incorporation into a flip-chip package. This is due to the density limitations associated with forming C4 arrays.

Figure 21:
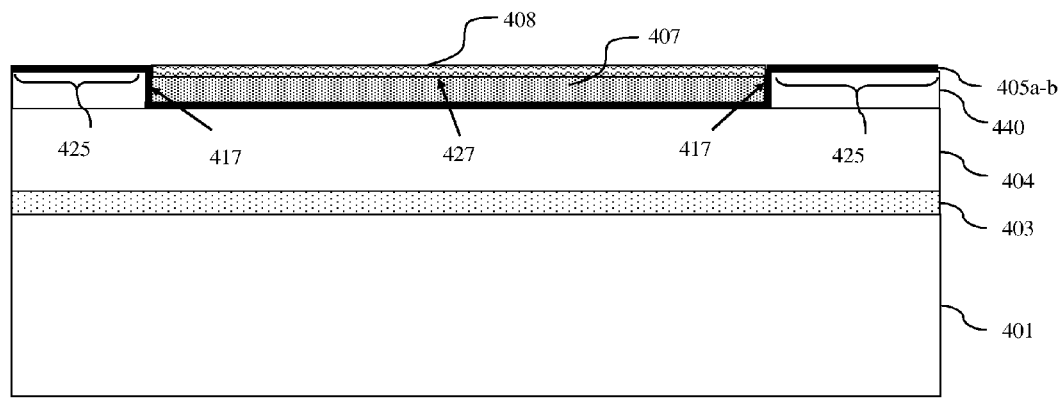
FIG. 21 is a cross-section diagram illustrating a partially completed integrated circuit structure formed according to the method of FIG. 16.
Figure 22:
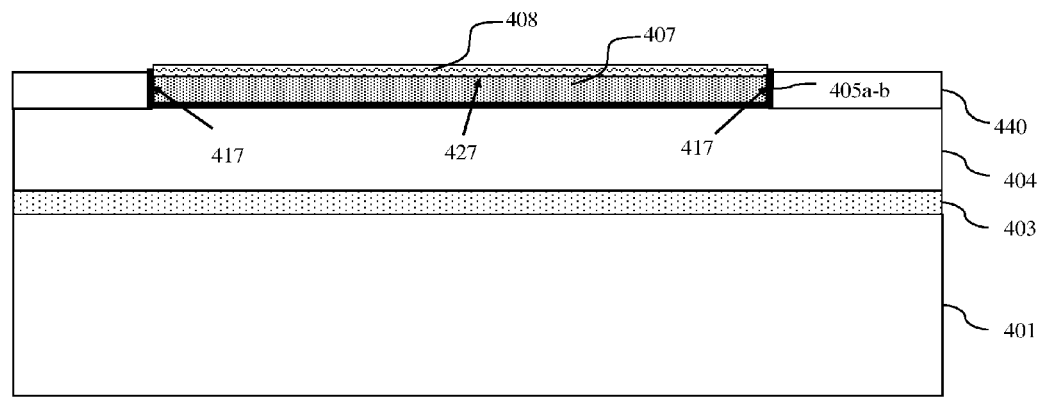
FIG. 22 is a cross-section diagram illustrating a partially completed integrated circuit structure formed according to the method of FIG. 16.
Figure 23A:
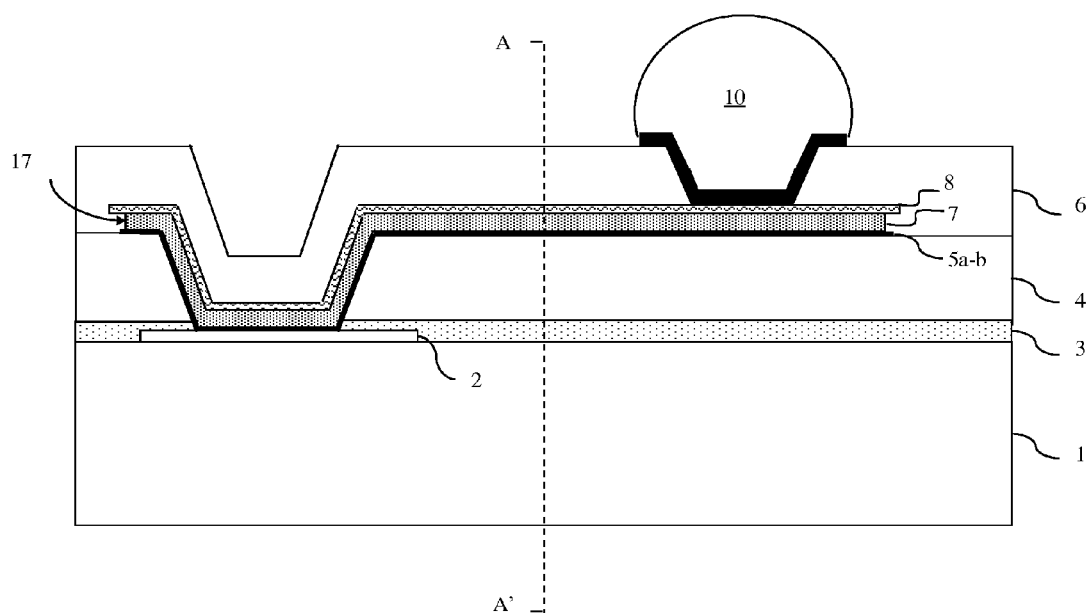
FIG. 23A is a cross-section diagram illustrating an integrated circuit structure that incorporates a metal layer with top surface passivation but not sidewall passivation.
Figure 23B:
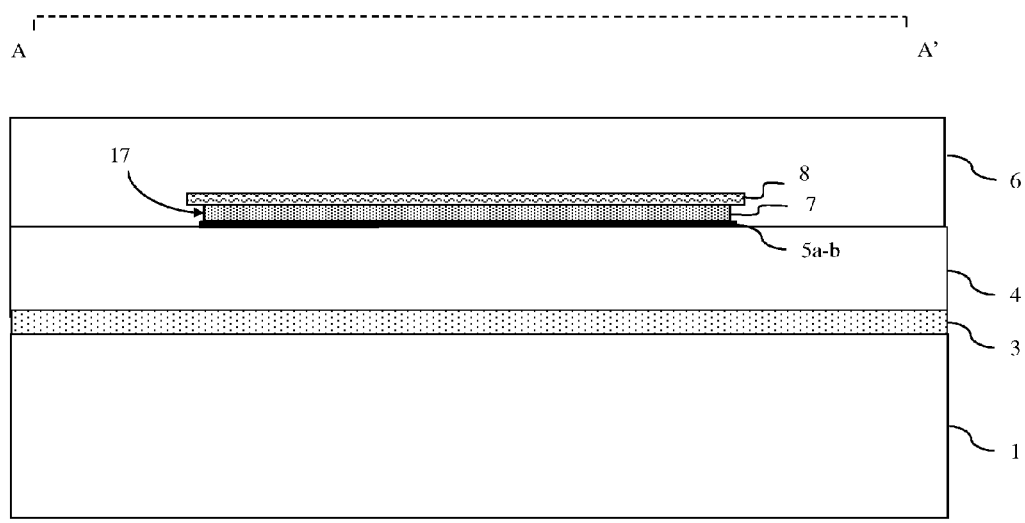
FIG. 23B is a different cross-section A-A' of the integrated circuit structure of FIG. 23A.

FIG. 23A is a cross-section diagram illustrating an exemplary integrated circuit structure, which was originally designed for wirebonding and which now includes a redistribution layer 7 so that it can be incorporated into a flip-chip package. FIG. 23B is a different cross-section A-A' of this same integrated circuit structure. As illustrated in FIGS. 23A-21B, the redistribution layer 7 (e.g., a conductive metal layer, such as a copper (Cu) layer) electrically connects a conductive pad 2 (e.g., a conductive metal pad, such as a copper (Cu) pad) to an offset solder bump 10 for a C4 connection. Unfortunately, as described in detail below, current low-cost processing techniques for forming such a redistribution layer 7 suffer from poor dimensional control due to insufficient sidewall passivation and, thereby reduced reliability.

Figure 24A:
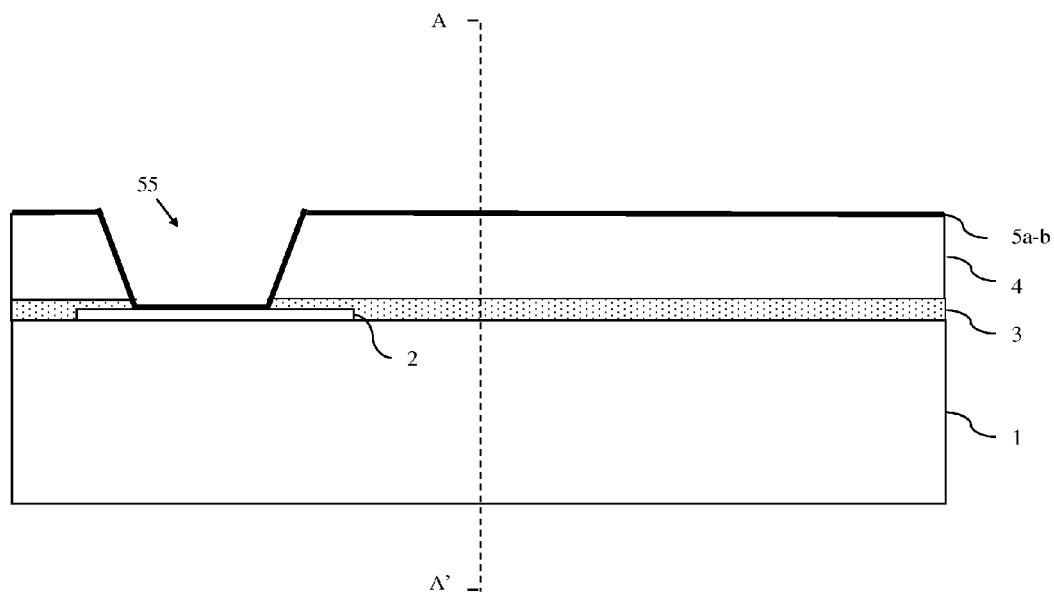
FIG. 24A is a cross-section diagram illustrating a partially completed integrated circuit structure.
Figure 24B:
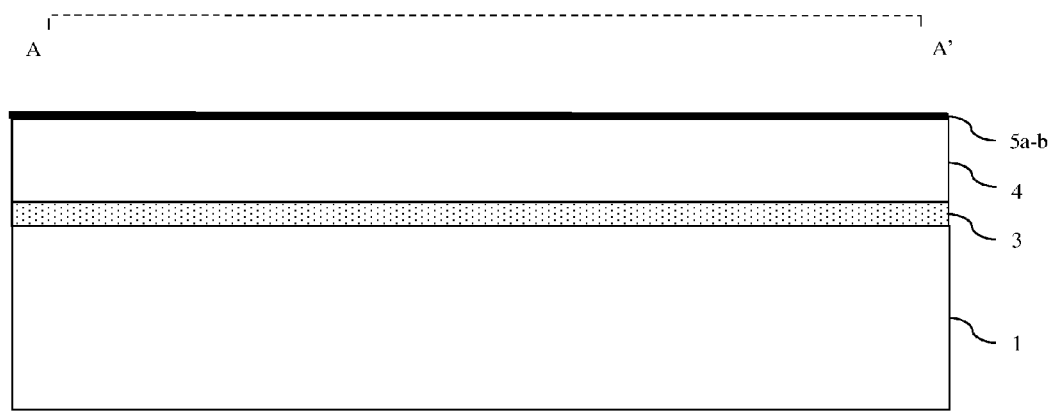
FIG. 24B is a different cross-section A-A' of the partially completed integrated circuit structure of FIG. 24A.

Specifically, an optional barrier layer 5a (e.g., a tantalum (Ta) layer or a tantalum nitride (TaN) layer) can be formed (e.g., by physical vapor deposition (PVD)) on the top surface of a polyimide layer 4 and a seed layer 5b (e.g., a conductive metal seed layer, for example, a copper seed layer for forming a copper redistribution layer) can be formed (e.g., by PVD) on the barrier layer 5a (see FIGS. 24A-B). FIG. 24A further illustrates that the barrier and seed layers 5a-b will also line any openings 55 that extend vertically through the polyimide layer 4 and any other dielectric layers 3 (e.g., silicon nitride (SiN) and/or silicon oxide ($SiO_2$) layers) to a conductive pad 2 (e.g., a conductive metal pad, such as a copper (Cu) pad) on the substrate 1. Although not shown, this conductive pad 2 can be electrically connected by a contact to one or more devices contained within the substrate 1.

Figure 25:
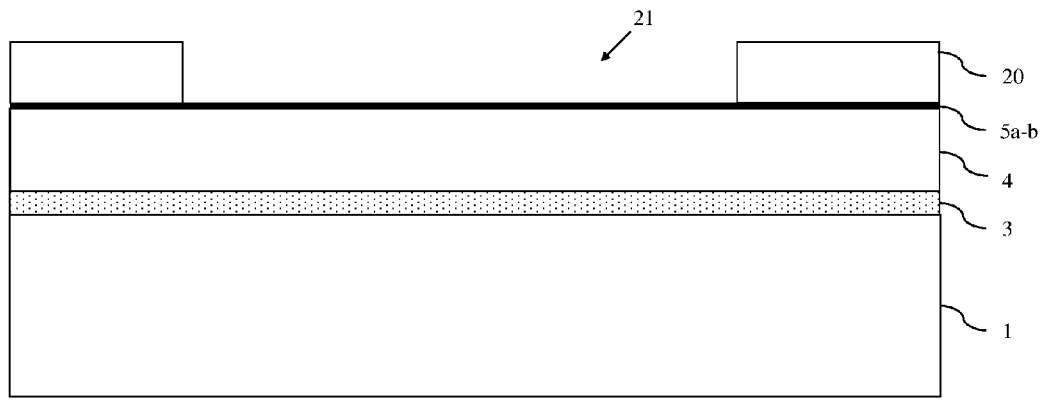
FIG. 25 is a cross-section diagram illustrating a partially completed integrated circuit structure.
Figure 26:
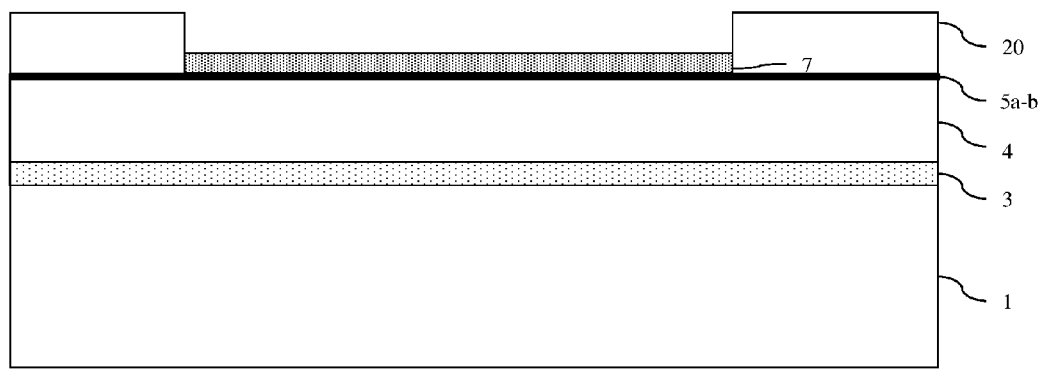
FIG. 26 is a cross-section diagram illustrating a partially completed integrated circuit structure.
Figure 27:
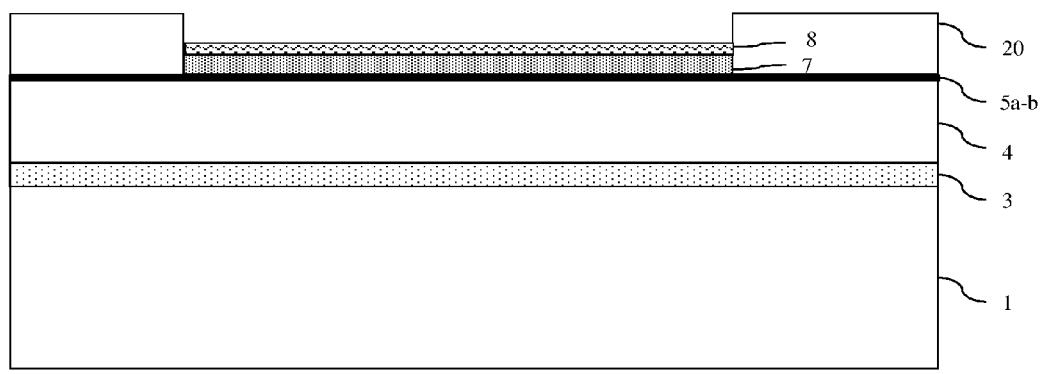
FIG. 27 is a cross-section diagram illustrating a partially completed integrated circuit structure.
Figure 28:
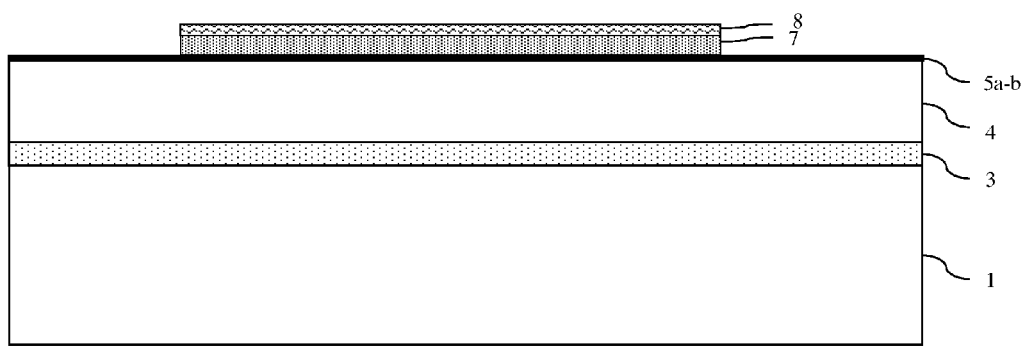
FIG. 28 is a cross-section diagram illustrating a partially completed integrated circuit structure.

A photoresist layer 20 can then be deposited onto the seed layer 5b and patterned (e.g., using conventional lithographic patterning techniques with a trench 21 having the desired shape for the redistribution layer (see FIG. 25). Next, the redistribution layer 7 (e.g., a conductive metal redistribution layer, such as a copper redistribution layer) can be formed (e.g., by conventional selective electroplating techniques) on the exposed portion of the seed layer 5b within the trench 21 (see FIG. 26). Then, a passivation layer 8 can be formed on the top surface of the redistribution layer 7 (see FIG. 27). After the passivation layer 8 is formed, the photoresist layer 20 can be selectively removed (see FIG. 28) and an etch process (e.g., a wet etch process) can be performed to remove the exposed portions of the seed and barrier layers 5a-b from the top surface of the polyimide layer 4 (see FIG. 29).

Figure 29:
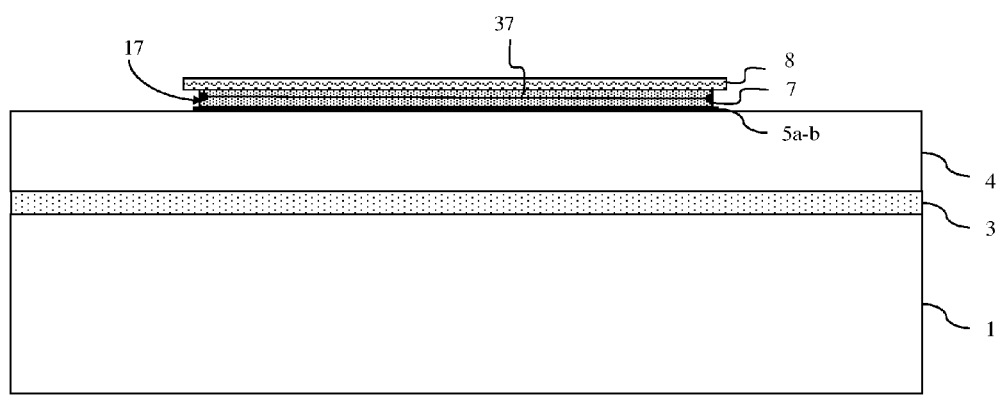
FIG. 29 is a cross-section diagram illustrating a partially completed integrated circuit structure.

In the above-described process steps, the material for the passivation layer 8 can be preselected so that the seed and barrier layers 5a-b can be selectively etched, during the wet etch process shown in FIG. 29, over the passivation layer 8. That is, so that the etch rate for the passivation layer 8 in the presence of the wet etchant is significantly slower than the etch rate for the seed and barrier layers 5a-b and, thus, so that the top surface of the redistribution layer 7 is protected from the etchant. However, as shown in FIG. 29, since the sidewalls 17 of the redistribution layer 7 are not protected by the passivation layer 8, the sidewalls 17 will be exposed to the etchant and, thereby etched back undercutting the passivation layer 8. Consequently, this technique does not allow for precise dimensional control (i.e., the width 37 of the redistribution layer 7 can not be precisely controlled). Poor dimensional control results in reduced reliability, particularly with continued size-scaling of integrated circuit structures.

In view of the foregoing, disclosed herein are embodiments of an integrated circuit structure that incorporates a metal layer (e.g., a redistribution layer) with both top surface and sidewall passivation and a method of forming the integrated circuit structure. In one embodiment of the structure, top surface and sidewall passivation of a first metal layer can be provided by a second metal layer. To form such a structure, a first metal layer can be selectively electroplated onto an exposed portion of a seed layer at the bottom surface of a trench, which extends through a mask layer. Then, the sidewalls of the first metal layer within the trench can be exposed (e.g., either by removing spacers within the trench or by shrinking the mask layer). After the sidewalls of the first metal layer are exposed, a second metal layer different from the first can be selectively electroplated onto both the top surface and sidewalls of the first metal layer. In another embodiment of the structure, sidewall passivation of a first metal layer can be provided by a dielectric layer and top surface passivation of that same first metal layer can be provided by a second metal layer. To form such a structure, a trench can be formed in a dielectric layer. Then, a seed layer can be formed over the dielectric layer and lining the trench. Next, a mask layer can be with an opening aligned above the trench (e.g., by stamping on a patterned organic mask layer). Then, a first metal layer can be selectively electroplated onto the exposed portion of the seed layer within the trench and a second metal layer different from the first can be electroplated onto the top surface of the first metal layer. Top surface and sidewall passivation of the first metal layer ensures that the first metal layer is protected during subsequent processing (e.g., an etch process to remove excess seed material). Thus, the embodiments provide greater dimensional control and, thereby greater reliability.

Figure 1A:
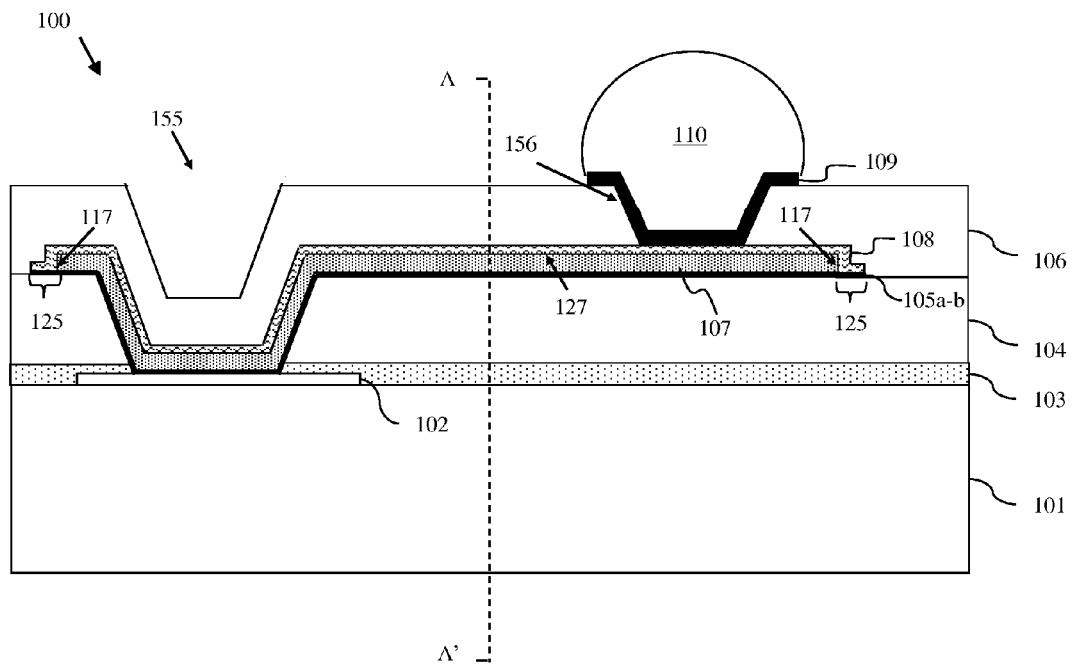
FIG. 1A is a cross-section diagram illustrating an embodiment of an integrated circuit structure that incorporates a metal layer with both top surface and sidewall passivation provided by another metal layer.
Figure 1B:
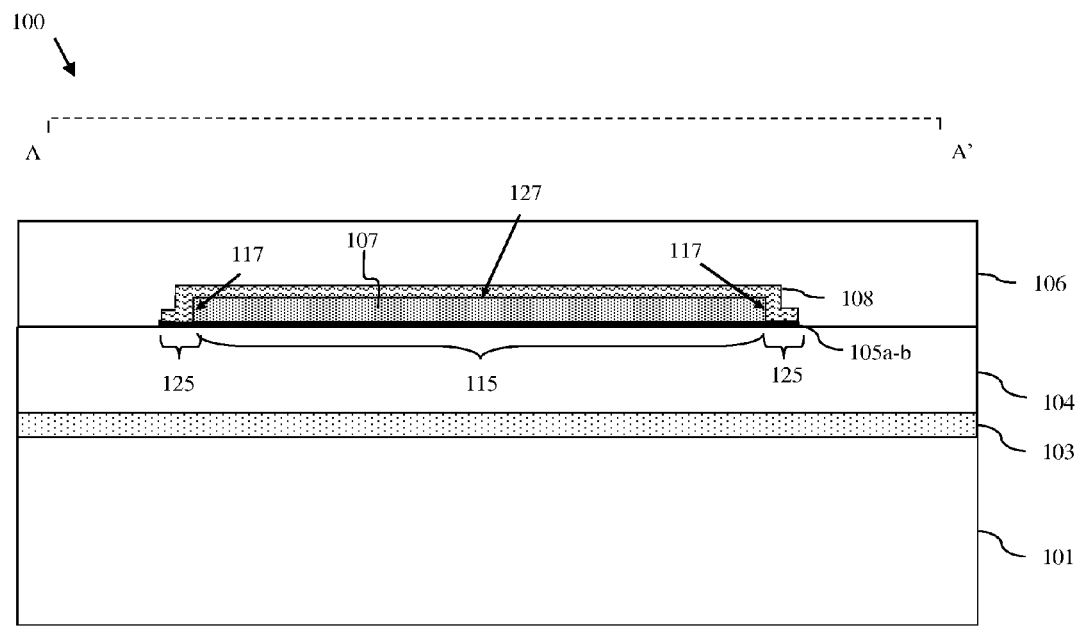
FIG. 1B is a different cross-section A-A' of the integrated circuit structure of FIG. 1A.

More particularly, FIG. 1A is a cross-section diagram illustrating an embodiment of an exemplary integrated circuit structure 100 according to the present invention that incorporates a metal layer (e.g., a redistribution layer) with both top surface and sidewall passivation provided by another metal layer. FIG. 1B is a different cross-section A-A' of this same integrated circuit structure 100.

As illustrated in FIGS. 1A-1B, the integrated circuit structure 100 can comprise a substrate 101. This substrate 101 can comprise a blanket interlayer dielectric layer (e.g., silicon dioxide ($SiO_2$), borophosphosilicate glass (BPSG) layer, or any other suitable interlayer dielectric material) over a semiconductor layer (e.g., a bulk silicon layer, a silicon layer of a silicon-on-insulator (SOI) structure or any other suitable semiconductor layer) comprising semiconductor devices (e.g., planar field effect transistors (FETs), non-planar FETs, bipolar transistors (BTs), heterojunction bipolar transistors (HBTs), diodes, resistors, capacitors, or any other semiconductor device), not shown.

At least one conductive pad 102 (e.g., a conductive metal pad, such as a copper (Cu) pad) can be positioned on the substrate 101. A contact (i.e., a conductive via), not shown, can electrically connect the conductive pad 102 to one or more of the semiconductor devices within the substrate 101. One or more first dielectric layers can positioned on the substrate 101 covering the conductive pad 102. Specifically, an etch stop layer 103 (e.g., a silicon nitride (SiN) layer) can be positioned on the conductive pad 102 and can extend laterally onto the substrate 101. Additionally, a polyimide layer 104 can be positioned on the etch stop layer 103. An opening 155 (e.g., a contact hole) can extend vertically through the first dielectric layer(s) 103-104 to the conductive pad 102.

A seed layer 105b can be positioned above the uppermost first dielectric layer (i.e., above the polyimide layer 104). The seed layer 105b can have first portion 115 (i.e., a center portion) laterally surrounded by second portions 125 (i.e., edge portions). FIG. 1A further illustrates that the seed layer 105b will also line the opening 155 that extends vertically through the first dielectric layer(s) 103-104 to the conductive pad 102. This seed layer 105b can comprise a conductive metal seed layer, such as, a copper seed layer. Optionally, one or more conductive diffusion barrier layers 105a can be positioned between the seed layer 105b and the top surface of the polyimide layer 104 and further between the seed layer 105b and the sidewalls and bottom surface of the opening 155. The barrier layer(s) 105a can comprise, for example, a tantalum (Ta) layer and/or a tantalum nitride (TaN) layer and can, for example, prevent migration of copper ions into the dielectric layers 103-104.

A first metal layer 107 (e.g., a redistribution layer), having a top surface 127 and sidewalls 117, can be positioned on the first portion 115 only (i.e., the center portion only) of the seed layer 105b. Thus, the second portions 125 (i.e., the edge portions) of the seed layer 105a (and similarly edge portions of any barrier layer(s) 105a) can extend laterally beyond the sidewalls 117 of the first metal layer 107. This first metal layer 107 can comprise, for example, a conductive metal layer (e.g., a copper (Cu) layer) selectively electroplated onto the first portion 115 of the seed layer 105b. Thus, as illustrated in FIG. 1A, the first metal layer 107 will be positioned on the seed layer 105b above the polyimide layer 104 and further on the seed layer 105b within the opening 155 that extends vertically through the first dielectric layer(s) 103-104 to the conductive pad 102.

A second metal layer 108 can be positioned on the second portions 125 (i.e., the edge portions) of the seed layer 105b and further on the sidewalls 117 and top surface 127 of the first metal layer 107. This second metal layer 108 can comprise a different metal material than the first metal layer 107 in order to passivate the top surface and sidewalls of the first metal layer 107. For example, the different metal material of the second metal layer 108 can be preselected so that it has a relatively slow etch rate when exposed to an etchant (e.g., a wet etchant) that is used during processing to remove excess seed and barrier material and, thus, so that it protects the top surface 127 and sidewalls 117 of the underlying first metal layer 107 during a seed/barrier etch. This second metal layer 108 can comprise, for example, any of the following: a gold layer, a nickel layer, a cobalt layer, a nickel boride layer, a nickel phosphide layer, a cobalt boride layer and a cobalt phosphide layer. This second metal layer 108 can be selectively electroplated onto the sidewalls 117 and top surface 127 of the first metal layer 107 as well as onto the portions 125 of the seed layer adjacent to the sidewalls 117. Thus, as illustrated in FIG. 1A, the second metal layer 108 will be positioned on the top surface 127 of the first metal layer 107 above the polyimide layer 104 and further on the top surface 127 of the first metal layer 107 within the opening 155 that extends vertically through the first dielectric layer(s) 103-104 to the conductive pad 102.

Additionally, the integrated circuit structure 100 can comprise a blanket second dielectric layer 106 (e.g., another polyimide layer) positioned on the second metal layer 108 and extending laterally beyond the second metal layer 108 onto the first dielectric layer 104. A second opening 156 (e.g., a solder resist opening) can extend vertically through this second dielectric layer 106 to the second metal layer 108. This second opening 156 can be offset from the opening 155, which extend to the conductive pad 102. For example, the openings 155 and 156 can be positioned at to opposite ends of the metal layer 107. At least one ball limiting metallurgy layer 109 can line the second opening 155. These BLM layers 109 can comprise, for example, an adhesion layer (e.g., a chromium (Cr) layer, a titanium (Ti) layer, a titanium-tungsten (Ti—W) layer or any other suitable adhesion layer) on the bottom surface and sidewalls of the opening 156, a barrier layer (e.g., a nickel (Ni) layer, a nickel-copper (Ni—Cu) layer, a palladium (Pd) layer, a platinum (Pt) layer, a chromium-copper (Cr—Cu) layer or any other suitable layer for preventing electro-migration) on the adhesion layer and a bonding layer (e.g., a copper (Cu) layer, a gold (Au) layer or any other suitable bonding layer) on the barrier layer. A solder ball 110 can be positioned on the uppermost ball limiting metallurgy layer such that the solder ball 110 is electrically connected to the conductive pad 102. The solder ball 110 can comprise any suitable solder material (e.g., tin, copper sliver, bismuth, indium, zinc, antimony, etc.).

For illustration purposes the above structure embodiment is described with respect to a redistribution layer (i.e., the first metal layer 107 with top surface and sidewall passivation provided by a second metal layer 108) that electrically connects a conductive pad 102 to an offset solder ball 110. It should, however, be understood that such a redistribution layer can, alternatively, be used to electrically connect two or more essentially identical conductive pads at different locations on the surface of the substrate 101.

Figure 2:
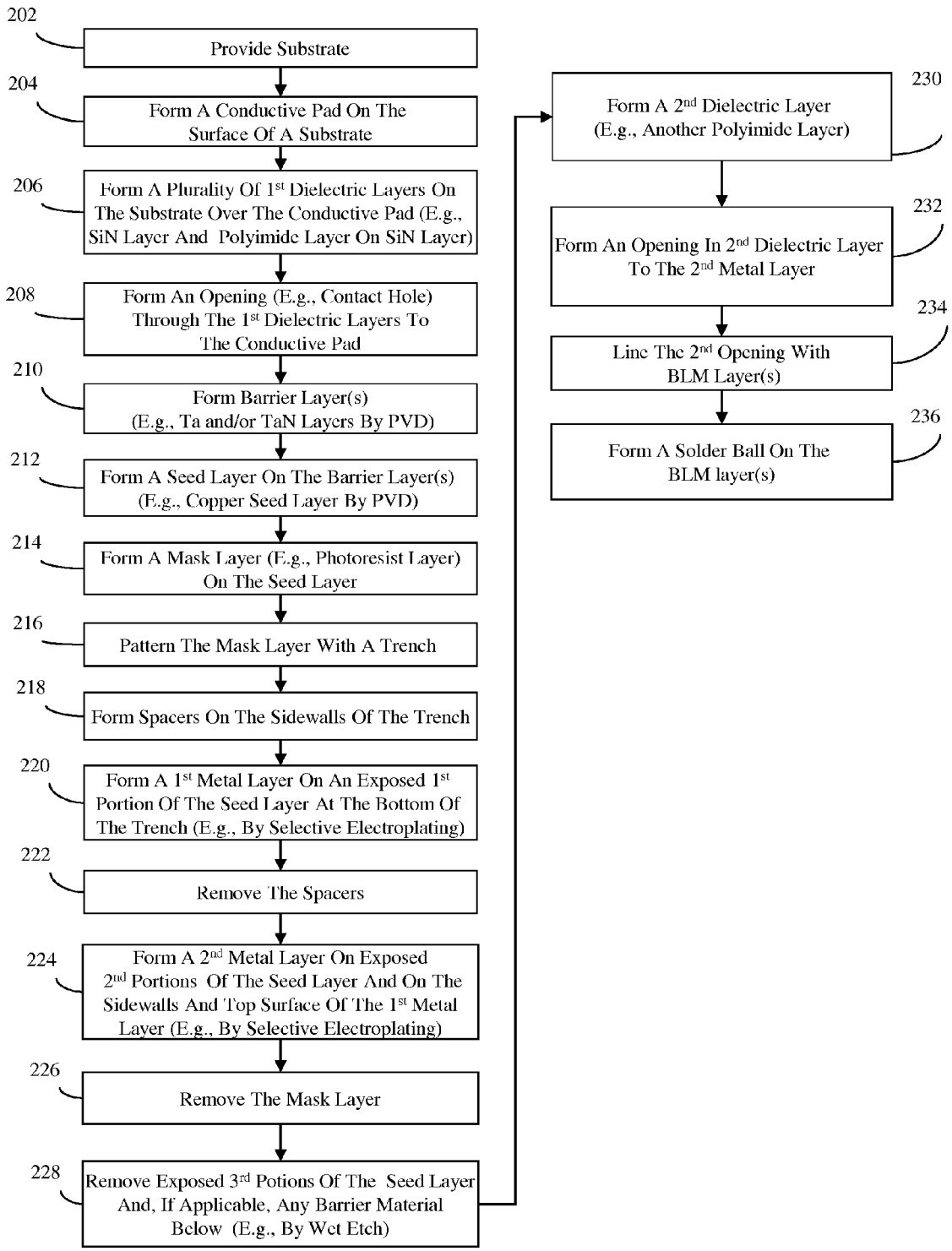
FIG. 2 is a flow diagram illustrating an embodiment of a method of forming the structure of FIG. 1A.
Figure 3A:
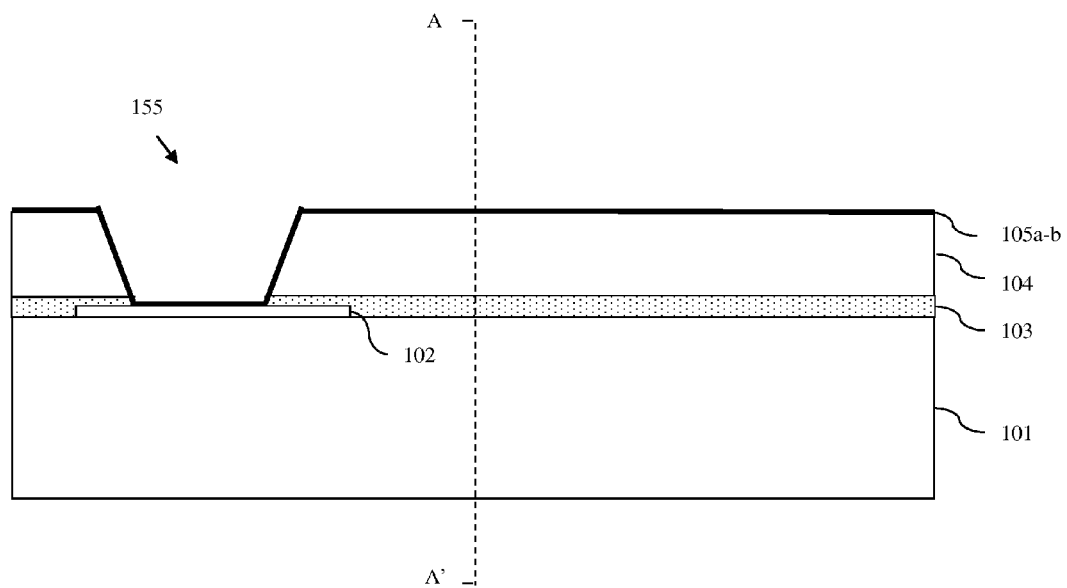
FIG. 3A is a cross-section diagram illustrating a partially completed integrated circuit structure formed according to the method of FIG. 2.
Figure 3B:
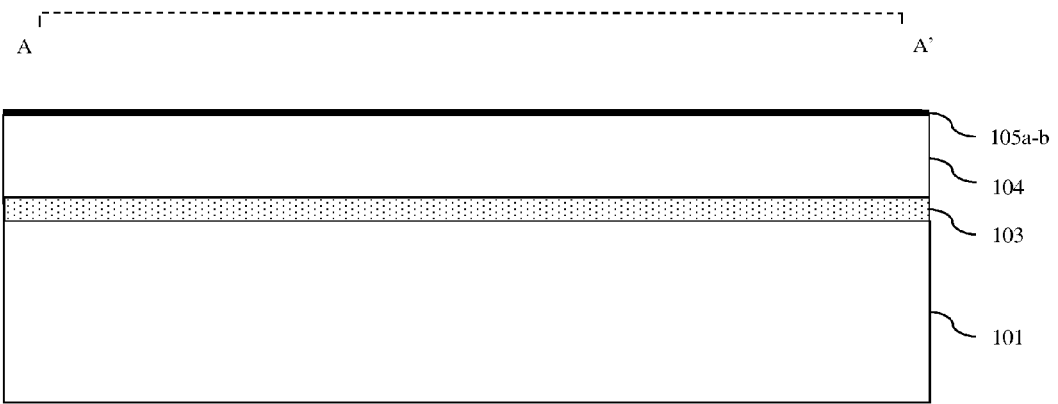
FIG. 3B is a different cross-section A-A' of the partially completed integrated circuit structure of FIG. 3A.

Referring to the flow diagram of FIG. 2, one embodiment of a method of forming the integrated circuit structure 100 of FIGS. 1A-B can comprise providing a substrate 101 (202, see FIGS. 3A-B). This substrate 101 can comprise a blanket interlayer dielectric layer (e.g., silicon dioxide ($SiO_2$), borophosphosilicate glass (BPSG) layer, or any other suitable interlayer dielectric material) over a semiconductor layer (e.g., a bulk silicon layer, a silicon layer of a silicon-on-insulator (SOI) structure or any other suitable semiconductor layer) comprising semiconductor devices (e.g., planar field effect transistors (FETs), non-planar FETs, bipolar transistors (BTs), heterojunction bipolar transistors (HBTs), diodes, resistors, capacitors, or any other semiconductor device), not shown.

At least one conductive pad 102 (e.g., a conductive metal pad, such as a copper (Cu) pad) can be formed on the surface of the substrate 101 such that it is electrically connected by a contact (i.e., a conductive via), not shown, to one or more of the semiconductor devices within the substrate 101 (204).

One or more first dielectric layers 103-104 can be formed on the substrate 101 covering the conductive pad 102 (206). Specifically, an etch stop layer 103 (e.g., a silicon nitride (SiN) layer) can be deposited (e.g., by low-pressure chemical vapor deposition (LPCVD)) onto the substrate 101 such that it covers the conductive pad 102. Additionally, a polyimide layer 104 can be formed on the etch stop layer 103. The polyimide layer 104 can be formed, for example, by spin casting a polyamic acid solution onto the etch stop layer 103 and, then, performing a thermal curing process which produces the polyimide. Alternatively, such a polyimide layer 104 can be formed by spin-on deposition and cure.

An opening 155 (e.g., a contact hole) can be formed that extends vertically through the first dielectric layer(s) 103-104 to the conductive pad 102 (208). For example, a patterned photoresist layer can be formed (e.g., using conventional lithographic patterning techniques) on the polyimide layer 104 and used as a mask layer during an etch process to form the opening 155.

After the opening 155 is formed at process 208, a seed layer 105b can be formed (e.g., deposited by physical vapor deposition (PVD)) on the polyimide layer 104 and lining the opening 155 (212). This seed layer 105b can comprise a conductive metal seed layer, such as, a copper seed layer. Optionally, prior to seed layer 105b formation at process 212, one or more conductive diffusion barrier layers 105a can be formed (e.g., by physical vapor deposition (PVD)) on the polyimide layer 104 and lining the opening 155 (210). Then, the seed layer 105b can be formed on the barrier layer(s) 105a. The barrier layer(s) 105a can comprise, for example, a tantalum (Ta) layer and/or a tantalum nitride (TaN) layer and can, for example, prevent migration of copper ions into the dielectric layers 103-104.

Figure 4:
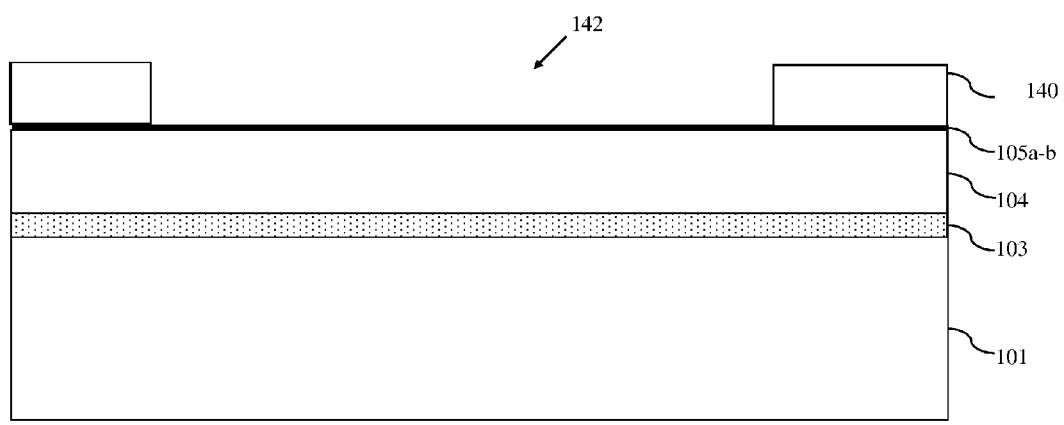
FIG. 4 is a cross-section diagram illustrating a partially completed integrated circuit structure formed according to the method of FIG. 2.

After the barrier and seed layers 105a-b are formed at processes 210-212, a mask layer 140 can be formed (e.g., deposited) on the seed layer 105b and a trench 142, that extends through the mask layer 140 to the seed layer 105b, can be formed (214-216, see FIG. 4). For example, a photoresist layer can be deposited onto the seed layer 105b and patterned (e.g., using conventional lithographic patterning techniques) with the trench 142.

Figure 5:
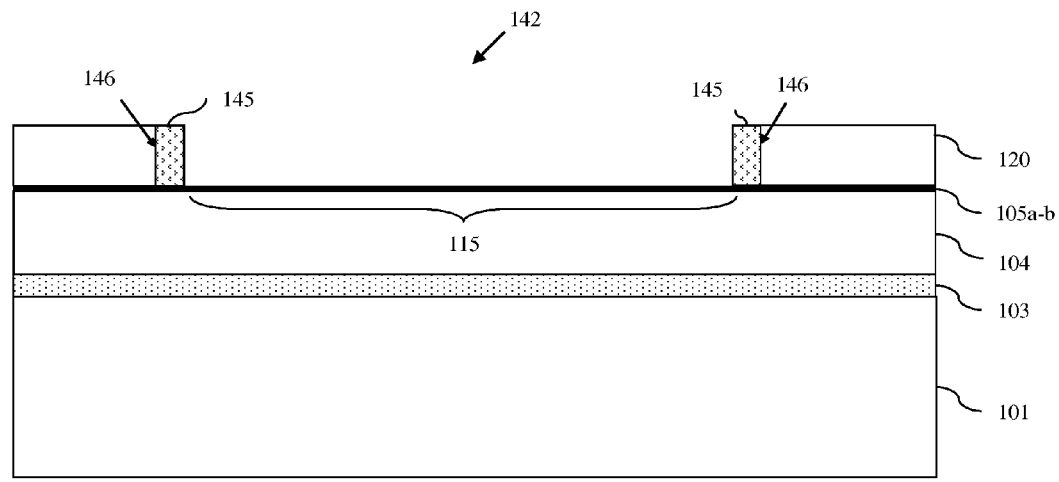
FIG. 5 is a cross-section diagram illustrating a partially completed integrated circuit structure formed according to the method of FIG. 2.

Next, spacers 145 can be formed within the trench 142 on the seed layer 105b and positioned laterally immediately adjacent to the sidewalls 146 of the trench 142 (i.e., the first sidewalls 146) such that a first portion 115 of the seed layer 105b remains exposed within the trench 142 (218, see FIG. 5). The spacers 145 can comprise oxide spacers (e.g., silicon dioxide ($SiO_2$) spacers) formed, for example, by depositing a conformal $SiO_2$ layer and, then, performing a directional etch process (e.g., a reactive ion etch (RIE) process) that selectively removes horizontal portions of the $SiO_2$ layer.

Figure 6:
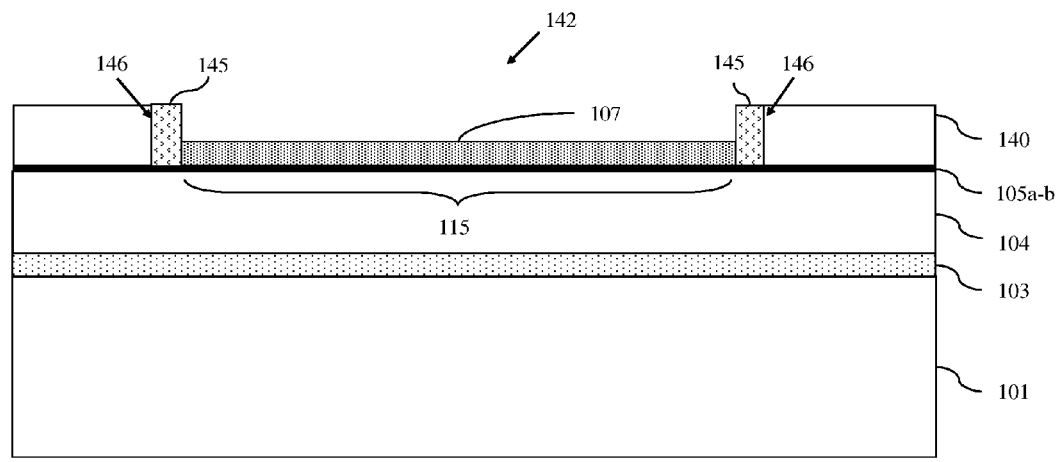
FIG. 6 is a cross-section diagram illustrating a partially completed integrated circuit structure formed according to the method of FIG. 2.

Once the spacers 145 are formed at process 218, a first metal layer 107 can be formed on the exposed first portion 115 of the seed layer 105b (220, see FIG. 6). Specifically, the first metal layer can comprise, for example, a conductive metal layer (e.g., a copper (Cu) layer) selectively electroplated onto the exposed first portion 115 of the seed layer 105b.

Figure 7:
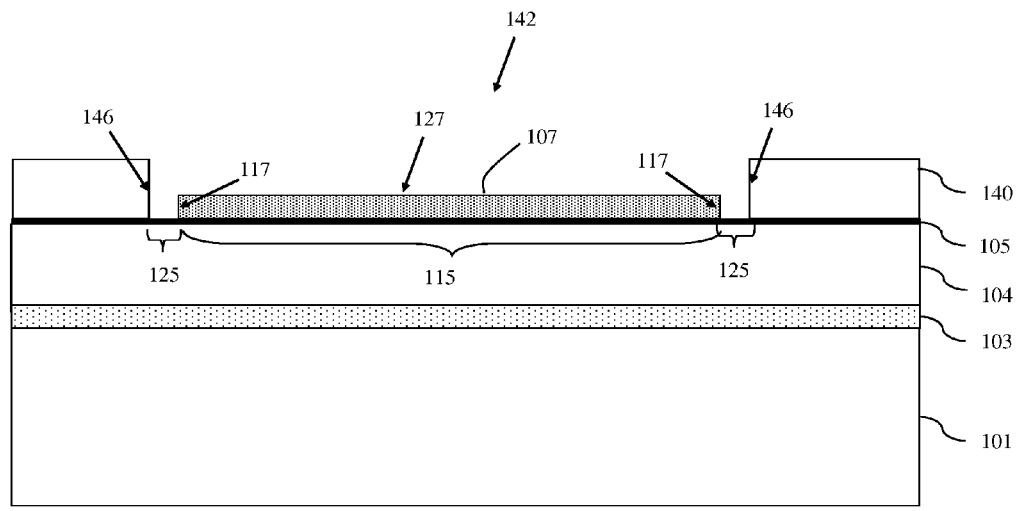
FIG. 7 is a cross-section diagram illustrating a partially completed integrated circuit structure formed according to the method of FIG. 2.

After the first metal layer 107 is formed at process 220, the spacers 145 can be removed (e.g., by a selective etch process) so as to expose the sidewalls 117 of the first metal layer 107 (i.e., the second sidewalls 117) and so as to also expose second portions 125 of the seed layer 105b adjacent to the sidewalls 117 of the first metal layer 105b and, particularly, extending laterally between the sidewalls 117 of the first metal layer 105b and the sidewalls 146 of the trench 142 (222, see FIG. 7).

Figure 8:
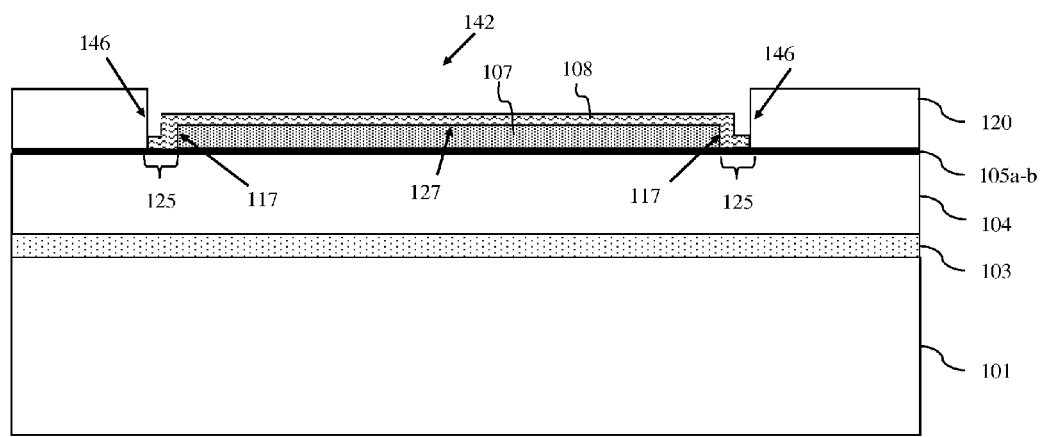
FIG. 8 is a cross-section diagram illustrating a partially completed integrated circuit structure formed according to the method of FIG. 2.

Next, a second metal layer 108 can be formed on the exposed second portions 125 of the seed layer 105b and on the exposed sidewalls 117 and top surface 127 of the first metal layer 107 (224, see FIG. 8). This second metal layer 108 can comprise a different metal material than the first metal layer 108. This different metal material can be preselected so that it has a relatively slow etch rate when exposed to an etchant (e.g., a wet etchant) used, as discussed in detail below at process 228, to remove excess seed and barrier material and, thus, so that it protects the top surface 127 and sidewalls 117 of the underlying first metal layer 107 during the process 228. This second metal layer 108 can comprise, for example, any of the following: a gold layer, a nickel layer, a cobalt layer, a nickel boride layer, a nickel phosphide layer, a cobalt boride layer and a cobalt phosphide layer. This second metal layer 108 can be selectively electroplated onto the first metal layer 107.

Figure 9:
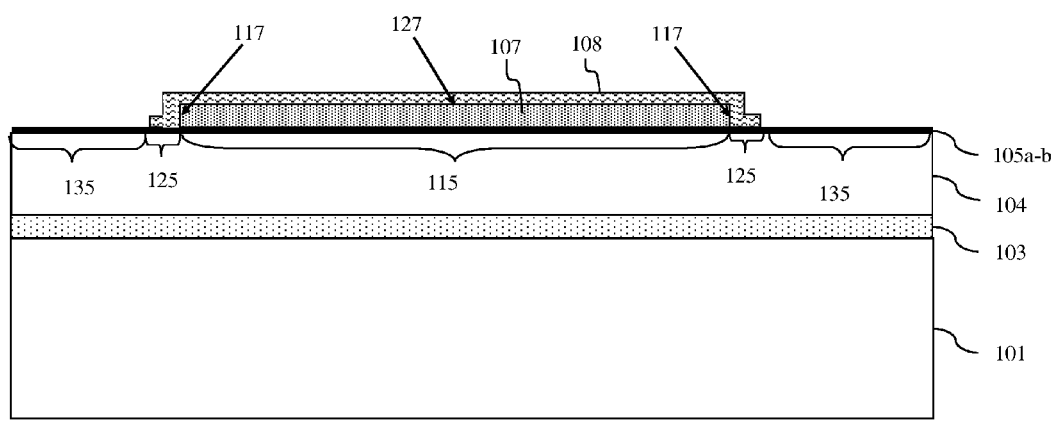
FIG. 9 is a cross-section diagram illustrating a partially completed integrated circuit structure formed according to the method of FIG. 2.

After the second metal layer 108 is formed, the mask layer 140 can be selectively removed so as to expose third portions 135 of the seed layer 105b adjacent to the second portions 125 (226, see FIG. 9).

Figure 10:
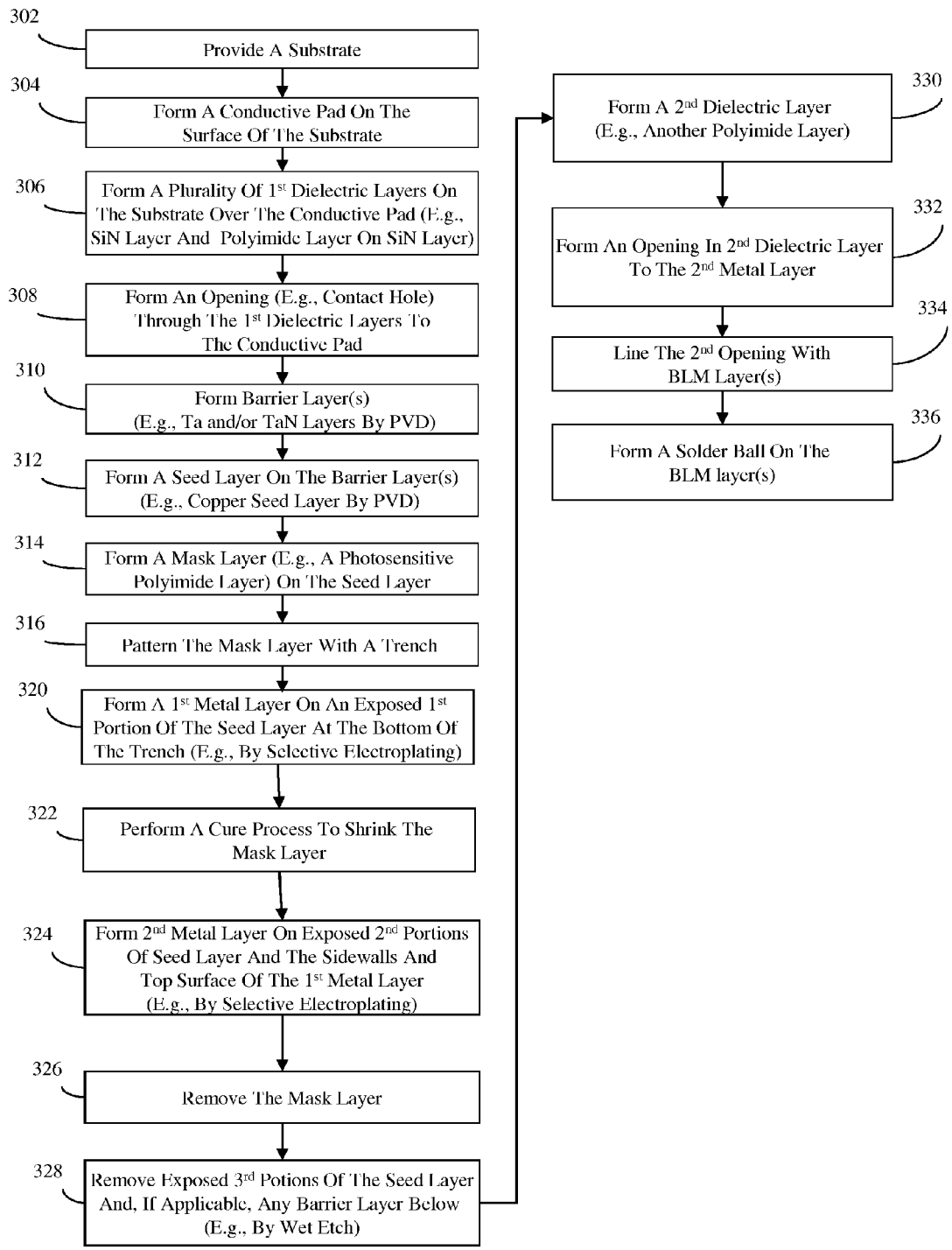
FIG. 10 is a flow diagram illustrating an alternative embodiment of a method of forming the structure of FIG. 1A.

Referring to the flow diagram of FIG. 10, another embodiment of a method of forming the integrated circuit structure 100 of FIGS. 1A-B can comprise providing a substrate 101 (302, see FIGS. 3A-B). At least one conductive pad 102 (e.g., a conductive metal pad, such as a copper (Cu) pad) can be formed on the surface of the substrate 101 such that it is electrically connected by a contact (i.e., a conductive via), not shown, to one or more of the semiconductor devices within the substrate 101 (304). One or more first dielectric layers 103-104 can be formed on the substrate 101 covering the conductive pad 102 (306) and an opening 155 (e.g., a contact hole), that extends vertically through the first dielectric layer(s) 103-104 to the conductive pad 102, can be formed (308). After the opening 155 is formed at process 308, a seed layer 105b can be formed (e.g., deposited by physical vapor deposition (PVD)) on the polyimide layer 104 and lining the opening 155 (312). Optionally, prior to seed layer 105b formation at process 312, one or more conductive diffusion barrier layers 105a can be formed (e.g., by physical vapor deposition (PVD)) on the polyimide layer 104 and lining the opening 155 (310). Then, the seed layer 105b can be formed on the barrier layer(s) 105a. It should be noted that the processes 302-312 of the method embodiment illustrated in the flow diagram of FIG. 10 are essentially the same as the process 202-212, respectively of the method embodiment illustrated in the flow diagram of FIG. 2 and described in greater detail above.

Figure 11:
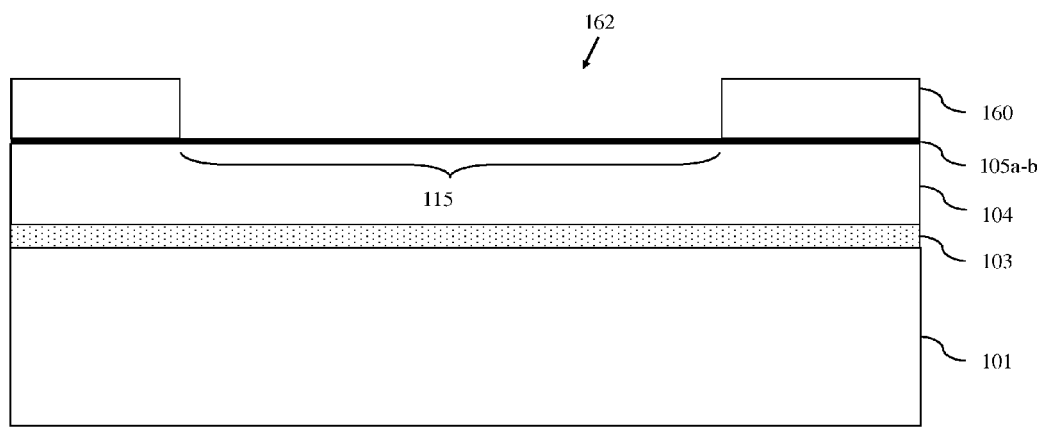
FIG. 11 is a cross-section diagram illustrating a partially completed integrated circuit structure formed according to the method of FIG. 10.

As with the previously described embodiment, after the seed layer 105b is formed, a mask layer is formed on the seed layer 105b (314, see FIG. 11). However, in this case, the mask layer 160 specifically comprises a photosensitive polyimide material rather than a photoresist material. The photosensitive polyimide material can be formed on the seed layer 105b, for example, by spin casting a polyamic acid solution onto the etch stop layer 103 and performing a thermal curing process. This thermal curing process can specifically be performed using a relatively low cure temperature (e.g., approximately 200° C.), which is sufficient to drive off (i.e., evaporate) the solvent in the polyamic solution, but not sufficient to complete polyimide cross-linking and densification.

Next, a trench 162 can be formed that extends through this mask layer 160 so as to expose a first portion 115 of the seed layer 105b (316). For example, a patterned photoresist layer can be formed (e.g., using conventional lithographic patterning techniques) on the mask layer 160 and used as an additional mask layer during an etch process to form the trench 162. After the trench 162 is formed, the pattern photoresist layer can be removed.

Figure 12:
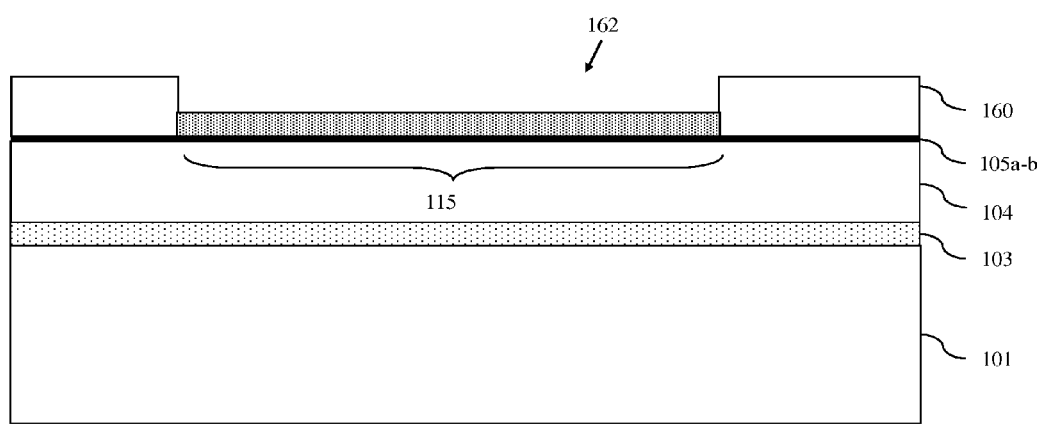
FIG. 12 is a cross-section diagram illustrating a partially completed integrated circuit structure formed according to the method of FIG. 10.

Then, a first metal layer 107 can be formed on the exposed first portion 115 of the seed layer 105b (320, see FIG. 12). Specifically, the first metal layer can comprise, for example, a conductive metal layer (e.g., a copper (Cu) layer) selectively electroplated onto the exposed first portion 115 of the seed layer 105b.

Figure 13:
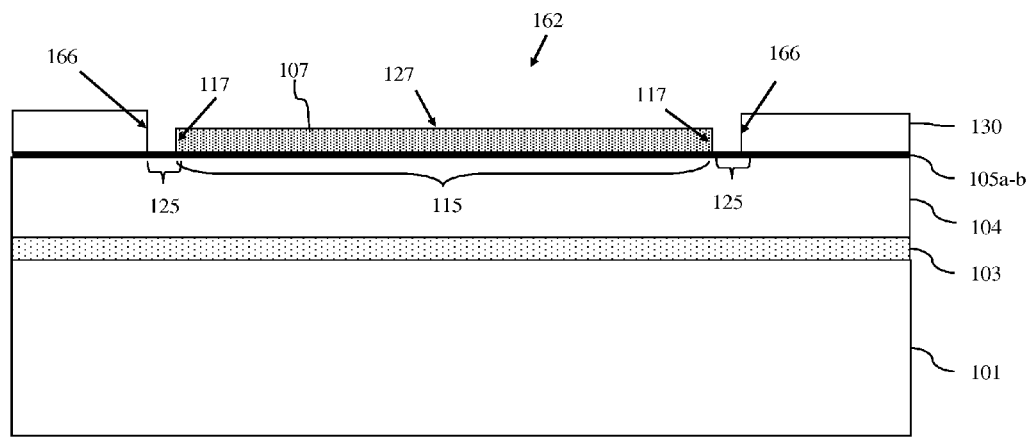
FIG. 13 is a cross-section diagram illustrating a partially completed integrated circuit structure formed according to the method of FIG. 10.

After the first metal layer 107 is formed at process 320, the photosensitive polyimide material can be subjected to an additional thermal cure process (322, see FIG. 13). This thermal curing process can specifically be performed using a relatively high cure temperature (e.g., approximately 300° C. or greater), which is sufficient to complete polyimide cross-linking and densification. Thus, this additional thermal cure process shrinks the mask layer 160 in size, exposing the sidewalls 117 of the first metal layer 107 and also exposing second portions 125 of the seed layer 105b adjacent to the sidewalls 117 of the first metal layer 107 and, particularly, extending between the sidewalls 117 of the first metal layer 107 and the sidewalls 166 of the trench 162. Those skilled in the art will recognize the amount of shrinkage exhibited by the mask layer during this additional cure process 322 can range, for example, between approximately 10 nm and 100 nm and will depend upon the initial volume of the material and the amount of shrinkage that occurs during thermal curing at 314.

Figure 14:
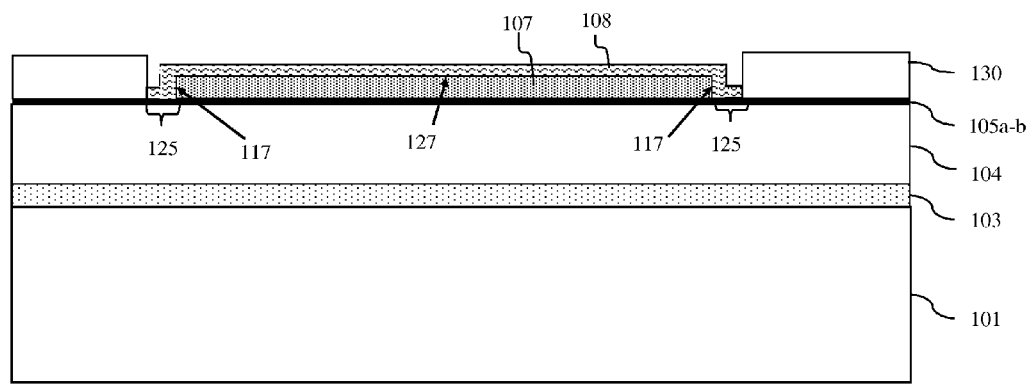
FIG. 14 is a cross-section diagram illustrating a partially completed integrated circuit structure formed according to the method of FIG. 10.

Next, a second metal layer 108 can be formed on the exposed second portions 125 of the seed layer 105b and on the exposed sidewalls 117 and top surface 127 of the first metal layer 107 (324, see FIG. 14). This second metal layer 108 can comprise a different metal material than the first metal layer 107. This different metal material can be preselected so that it has a relatively slow etch rate when exposed to an etchant (e.g., a wet etchant) used, as discussed in detail below at process 328, to remove excess seed and barrier material and, thus, so that it protects the top surface 127 and sidewalls 117 of the underlying first metal layer 107 during the process 328. This second metal layer 108 can comprise, for example, any of the following: a gold layer, a nickel layer, a cobalt layer, a nickel boride layer, a nickel phosphide layer, a cobalt boride layer and a cobalt phosphide layer. This second metal layer 108 can be selectively electroplated onto the first metal layer 107.

After the second metal layer 108 is formed, the mask layer 160 can be selectively removed so as to expose third portions 135 of the seed layer 105b adjacent to the second portions 125 (326, see FIG. 9).

In each of the above-described method embodiments, processing is essentially the same following formation of the second metal layer and removal of the mask layer to expose third portions of the seed layer. Specifically, referring to both the flow diagram of FIG. 3 and the flow diagram of FIG. 10 as well as the integrated circuit structure cross-section illustrations of FIGS. 1A-1B, an etch process (e.g., a wet etch process) can be performed to remove the exposed third portions 135 of the seed layer 105b, which were positioned laterally adjacent to the second metal layer 108 as shown in FIG. 9, as well as any barrier material that was below those third portions 135 of the seed layer 105b (228, 328). It should be noted that the second metal layer 108 passivates the top surface 127 and sidewalls 117 of the first metal layer 107 such that, during this etch process, dimensional control is maintained over the first metal layer 107 (i.e., such that the size of the first metal layer 107, as formed at process 220, remains essentially constant). Thus, in the method embodiment illustrated in FIG. 3, to ensure that the first metal layer 107 has a desired shape and size (e.g., area), the trench 142 is patterned at process 216 with the desired shape, although with a slightly larger size (e.g., covering a slightly larger area) taking into consideration the width of the sidewall spacers 145 that will be formed at process 218 so that the portion 115 of the seed layer 105b on to which the first metal layer 107 will be selectively electroplated at process 220 has the both the desired size and shape. Whereas, in the method embodiment illustrated in FIG. 10, to ensure that the first metal layer 107 has a desired shape and size (e.g., area), the trench 162 is patterned at process 316 with the desired shape as well as the desired size.

Next, a blanket second dielectric layer 106 (e.g., an additional polyimide layer) can be formed above the second metal layer 108 such that it extends laterally beyond the second metal layer 108 onto the first dielectric layer 104 (230, 330). This additional polyimide layer 106 can be formed, for example, by spin casting a polyamic acid solution onto the etch stop layer 103 and, then, performing a thermal curing process which produces the polyimide.

Alternatively, this additional polyimide layer 106 can be formed by spin-on deposition and cure.

A second opening 156 (e.g., a solder resist opening) can then be formed such that it extends vertically through the second dielectric layer 106 to the second metal layer 108 (232, 332). This second opening 156 can be offset from the opening 155 to the conductive pad 102 (e.g., at opposite ends of the metal layer 107). After the second opening 156 is formed, the second opening 156 can be lined with at least one ball limiting metallurgy layer 109 (234, 334). These BLM layers 109 can comprise, for example, an adhesion layer (e.g., a chromium (Cr) layer, a titanium (Ti) layer, a titanium-tungsten (Ti—W) layer or any other suitable adhesion layer), a barrier layer (e.g., a nickel (Ni) layer, a nickel-copper (Ni—Cu) layer, a palladium (Pd) layer, a platinum (Pt) layer, a chromium-copper (Cr—Cu) layer or any other suitable layer for preventing electro-migration) on the adhesion layer and a bonding layer (e.g., a copper (Cu) layer, a gold (Au) layer or any other suitable bonding layer) on the barrier layer. Once the BLM layer(s) 109 are formed, a solder ball 110 can be formed on the uppermost ball limiting metallurgy layer 109 such that the solder ball 110 is electrically connected to the conductive pad 102 (236, 336). The solder ball 110 can comprise any suitable solder material (e.g., tin, copper sliver, bismuth, indium, zinc, antimony, etc.). Techniques used for forming solder resist openings, for lining such openings with BLM layer(s) 109 and for forming solder balls 110 on BLM layers are well-known in the art. Thus, the details of such techniques are omitted from this specification in order to allow the reader to focus on the salient aspects of the invention.

For illustration purposes the above method embodiments are described with respect to the formation of a redistribution layer (i.e., the first metal layer 107 having sidewall and top surface passivation provided by a second metal layer 108) that electrically connects a conductive pad 102 to an offset solder ball 110. It should, however, be understood that such a redistribution layer can, alternatively, be formed so that it electrically connects two or more essentially identical conductive pads formed at different locations on the surface of the substrate 101.

Figure 15A:
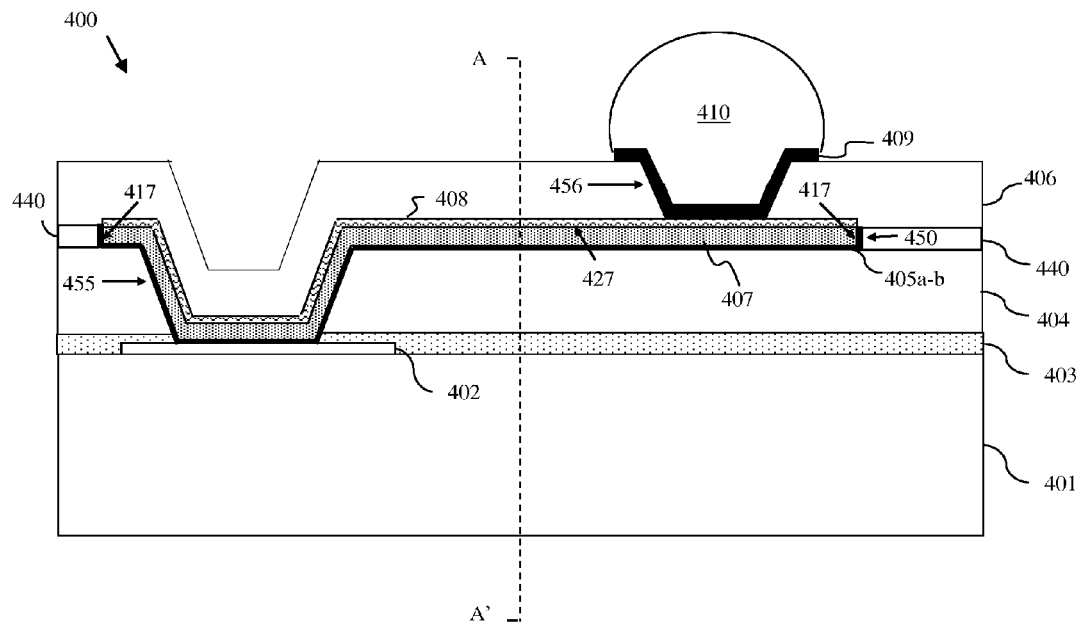
FIG. 15A is a cross-section diagram illustrating an embodiment of an integrated circuit structure that incorporates a metal layer with top surface passivation provided by another metal layer and sidewall passivation provided by a dielectric layer.
Figure 15B:
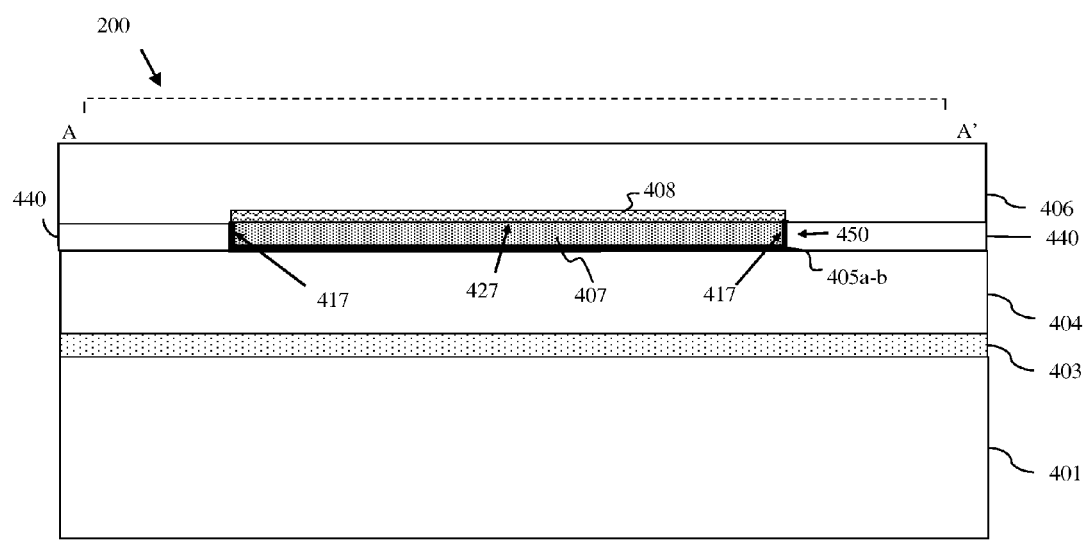
FIG. 15B is a different cross-section A-A' of the integrated circuit structure of FIG. 15A.

FIG. 15A is a cross-section diagram illustrating another embodiment of an exemplary integrated circuit structure 400 according to the present invention that incorporates a metal layer (e.g., a redistribution layer) with top surface passivation provided by another metal layer and sidewall passivation provided by a dielectric layer (e.g., a photosensitive polyimide layer). FIG. 15B is a different cross-section A-A' of this same integrated circuit structure 400.

Specifically, as illustrated in FIGS. 15A-15B, the integrated circuit structure 400 can comprise a substrate 401. This substrate 401 can comprise a blanket interlayer dielectric layer (e.g., silicon dioxide ($SiO_2$), borophosphosilicate glass (BPSG) layer, or any other suitable interlayer dielectric material) over a semiconductor layer (e.g., a bulk silicon layer, a silicon layer of a silicon-on-insulator (SOI) structure or any other suitable semiconductor layer) comprising semiconductor devices (e.g., planar field effect transistors (FETs), non-planar FETs, bipolar transistors (BTs), heterojunction bipolar transistors (HBTs), diodes, resistors, capacitors, or any other semiconductor device), not shown.

At least one conductive pad 402 (e.g., a conductive metal pad, such as a copper (Cu) pad) can be positioned on the substrate 401. A contact (i.e., a conductive via), not shown, can electrically connect the conductive pad 402 to one or more of the semiconductor devices within the substrate 401. One or more first dielectric layers can positioned on the substrate 401 covering the conductive pad 402. Specifically, an etch stop layer 403 (e.g., a silicon nitride (SiN) layer) can be positioned on the conductive pad 402 and can further extend laterally onto the substrate 401. A polyimide layer 404 can be positioned on the etch stop layer 403. Additionally, a second dielectric layer 440 (e.g., another polyimide layer, such as a photosensitive polyimide layer) can be positioned on the uppermost first dielectric layer (i.e., on the polyimide layer 404).

A trench 45 (e.g., a wiring trench) can extend vertically through the second dielectric layer 440 to the uppermost first dielectric layer 404. Additionally, an opening 455 (e.g., a contact hole) can extend vertically from the bottom surface of the trench 450 through the first dielectric layer(s) 403-404 to the conductive pad 402.

A seed layer 405b can line the bottom surface and sidewalls of the trench 456 as well as the bottom surface and sidewalls of the opening 456. This seed layer 405b can comprise a conductive metal seed layer, such as, a copper seed layer. Optionally, one or more conductive diffusion barrier layers 405a can line the trench 456 and opening 455 and the seed layer 405b can be positioned on the barrier layer(s) 405b. Thus, the barrier layer(s) 405(b) are positioned between the seed layer 405b and the bottom surface and sidewalls of the trench 450 as well as between the seed layer 405b and the bottom surface and sidewalls of the opening 450. The barrier layer(s) 405a can comprise, for example, a tantalum (Ta) layer and/or a tantalum nitride (TaN) layer and can, for example, prevent migration of copper ions into the dielectric layers 403-404 and 440.

A first metal layer 407 (e.g., a redistribution layer), having a top surface 427 and sidewalls 417, can be positioned on the seed layer 405b within the trench 450 and also within the opening 455. This first metal layer 407 can comprise, for example, a conductive metal layer (e.g., a copper (Cu) layer) selectively electroplated onto the seed layer 405b.

A second metal layer 408 can be positioned on the top surface 427 of the first metal layer 407. This second metal layer 408 can comprise a different metal material than the first metal layer 407 in order to passivate the top surface of the first metal layer 407. For example, the different metal material of the second metal layer 408 can be preselected so that it has a relatively slow etch rate when exposed to an etchant (e.g., a wet etchant) that is used during processing to remove excess seed and barrier material and, thus, so that it protects the top surface 427 of the underlying first metal layer 407 during a seed/barrier etch. It should be noted that the polyimide layer 440, within which the trench 450 is formed, provides sidewall passivation. That is, the polyimide layer 440 protects the sidewalls 417 of the first metal layer 407 during this same seed/barrier etch. This second metal layer 408 can comprise, for example, any of the following: a gold layer, a nickel layer, a cobalt layer, a nickel boride layer, a nickel phosphide layer, a cobalt boride layer and a cobalt phosphide layer. This second metal layer 408 can be selectively electroplated onto the top surface 427 of the first metal layer 407. Thus, as illustrated in FIG. 15A, the second metal layer 408 will be positioned on the top surface of the first metal layer 407 within the trench 450 above the polyimide layer 404 and further on the top surface 427 of the first metal layer 407 within the opening 455 that extends vertically from the bottom surface of the trench 450 through the first dielectric layer(s) 403-404 to the conductive pad 402.

Additionally, the integrated circuit structure 400 can comprise a blanket third dielectric layer 406 (e.g., yet another polyimide layer) positioned above the second metal layer 408 and further extending laterally beyond the second metal layer 408 onto the second dielectric layer 440. A second opening 456 (e.g., a solder resist opening) can extend vertically through the third dielectric layer 406 to the second metal layer 408. This second opening 456 can be offset from the opening 455 to the conductive pad 402 (e.g., at opposite ends of the metal layer 407). At least one ball limiting metallurgy layer 409 can line this second opening 456. These BLM layers 409 can comprise, for example, an adhesion layer (e.g., a chromium (Cr) layer, a titanium (Ti) layer, a titanium-tungsten (Ti—W) layer or any other suitable adhesion layer), a barrier layer (e.g., a nickel (Ni) layer, a nickel-copper (Ni—Cu) layer, a palladium (Pd) layer, a platinum (Pt) layer, a chromium-copper (Cr—Cu) layer or any other suitable layer for preventing electro-migration) on the adhesion layer and a bonding layer (e.g., a copper (Cu) layer, a gold (Au) layer or any other suitable bonding layer) on the barrier layer. A solder ball 110 can be positioned on the uppermost ball limiting metallurgy layer such that the solder ball 110 is electrically connected to the conductive pad 102. The solder ball 110 can comprise any suitable solder material (e.g., tin, copper sliver, bismuth, indium, zinc, antimony, etc.).

For illustration purposes the above structure embodiment is described with respect to a redistribution layer (i.e., the first metal layer 407 having top surface passivation provided by the second metal layer 408 and sidewall passivation provided by the dielectric layer 440) that electrically connects a conductive pad 402 to an offset solder ball 410. It should, however, be understood that such a redistribution layer can, alternatively, be used to electrically connect two or more essentially identical conductive pads at different locations on the surface of the substrate 401.

Figure 16:
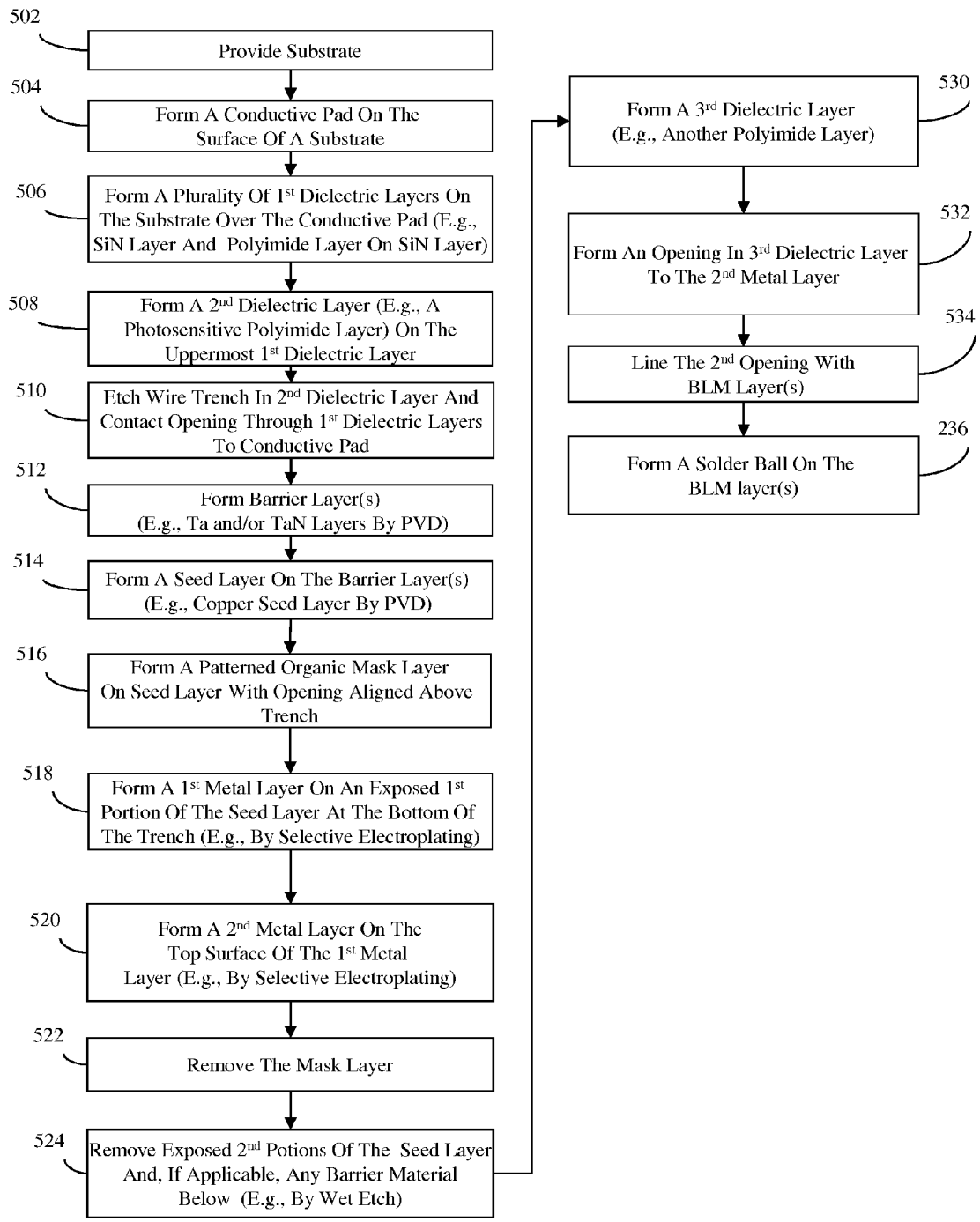
FIG. 16 is a flow diagram illustrating an embodiment of a method of forming the structure of FIG. 15A.
Figure 17A:
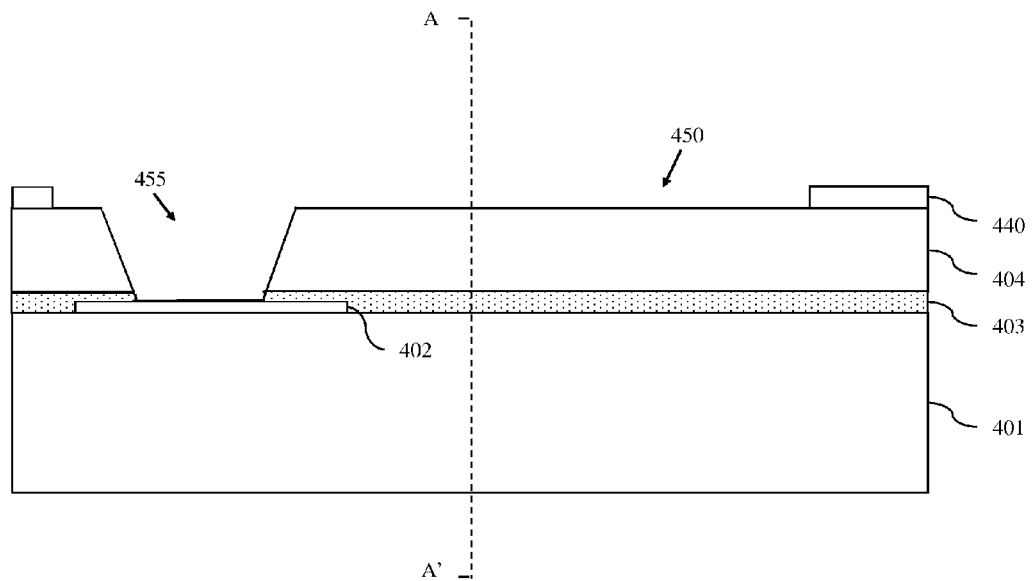
FIG. 17A is a cross-section diagram illustrating a partially completed integrated circuit structure formed according to the method of FIG. 16.
Figure 17B:
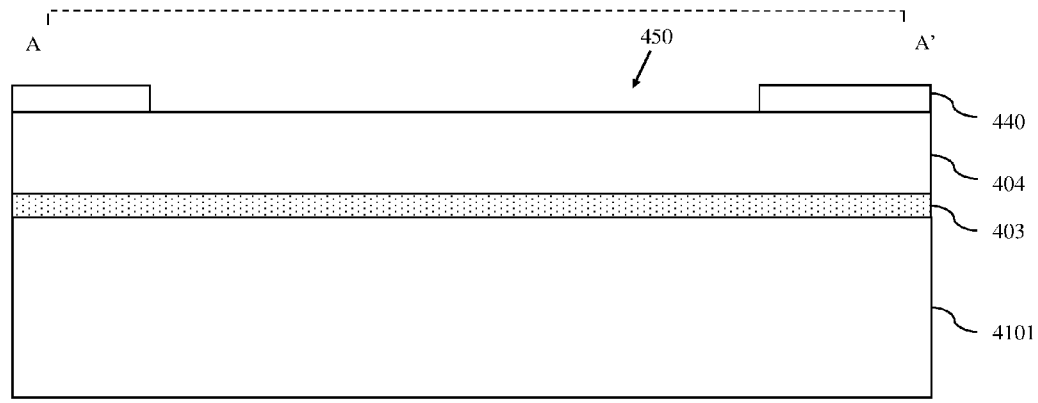
FIG. 17B is a different cross-section A-A' of the partially completed integrated circuit structure of FIG. 17A.

Referring to the flow diagram of FIG. 16, an embodiment of a method of forming the integrated circuit structure 400 of FIGS. 15A-B can comprise providing a substrate 401 (502, see FIGS. 17A-17B). This substrate 401 can comprise a blanket interlayer dielectric layer (e.g., silicon dioxide ($SiO_2$), borophosphosilicate glass (BPSG) layer, or any other suitable interlayer dielectric material) over a semiconductor layer (e.g., a bulk silicon layer, a silicon layer of a silicon-on-insulator (SOI) structure or any other suitable semiconductor layer) comprising semiconductor devices (e.g., planar field effect transistors (FETs), non-planar FETs, bipolar transistors (BTs), heterojunction bipolar transistors (HBTs), diodes, resistors, capacitors, or any other semiconductor device), not shown. At least one conductive pad 402 (e.g., a conductive metal pad, such as a copper (Cu) pad) can be formed on the surface of the substrate 401 such that it is electrically connected by a contact (i.e., a conductive via), not shown, to one or more of the semiconductor devices within the substrate 401 (504).

One or more first dielectric layers 403-404 can be formed on the substrate 401 covering the conductive pad 402 (506). Specifically, an etch stop layer 403 (e.g., a silicon nitride (SiN) layer) can be deposited (e.g., by low-pressure chemical vapor deposition (LPCVD)) onto the substrate 401 such that it covers the conductive pad 402. Additionally, a polyimide layer 404 can be formed on the etch stop layer 403, for example, by spin casting a polyamic acid solution onto the etch stop layer 403 and, then, performing a thermal curing process which produces the polyimide. Alternatively, such a polyimide layer 404 can be formed by spin-on deposition and cure.

A second dielectric layer 440 can be formed on the uppermost first dielectric layer (i.e., on the polyimide layer 404) (508). For example, a photosensitive polyimide layer can be deposited in the same manner as discussed above at process 506 with regard to polyimide layer 404. Then, conventional dual damascene processing can be used to form a trench 450 (e.g., a wire trench) in second dielectric layer 440 and an opening 455 (e.g., a contact hole) extending from the bottom surface of the trench 450 through the first dielectric layer 403-404 to the conductive pad 402 (510).

Figure 18A:
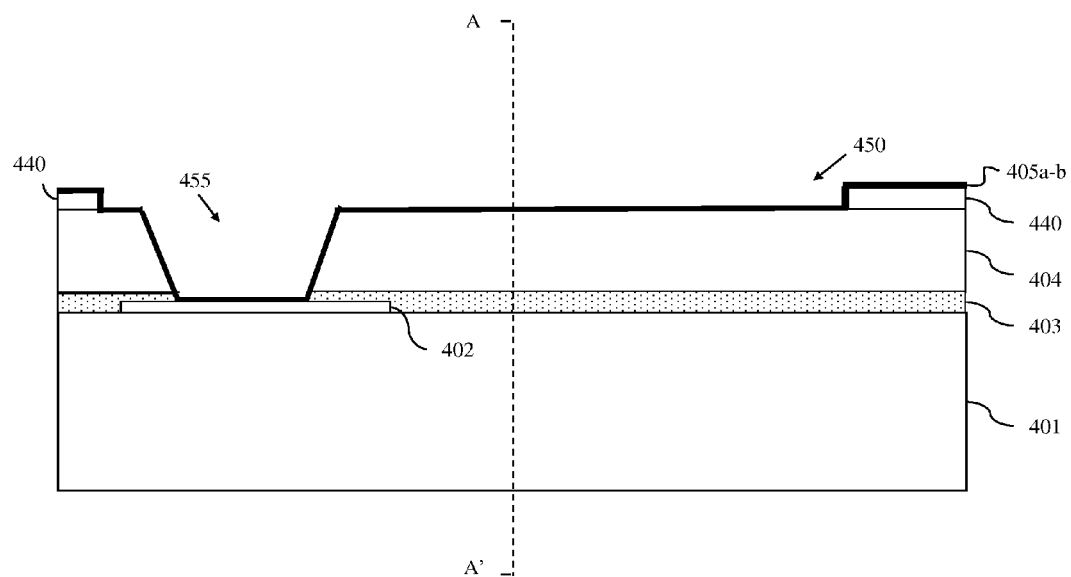
FIG. 18A is a cross-section diagram illustrating a partially completed integrated circuit structure formed according to the method of FIG. 16.
Figure 18B:
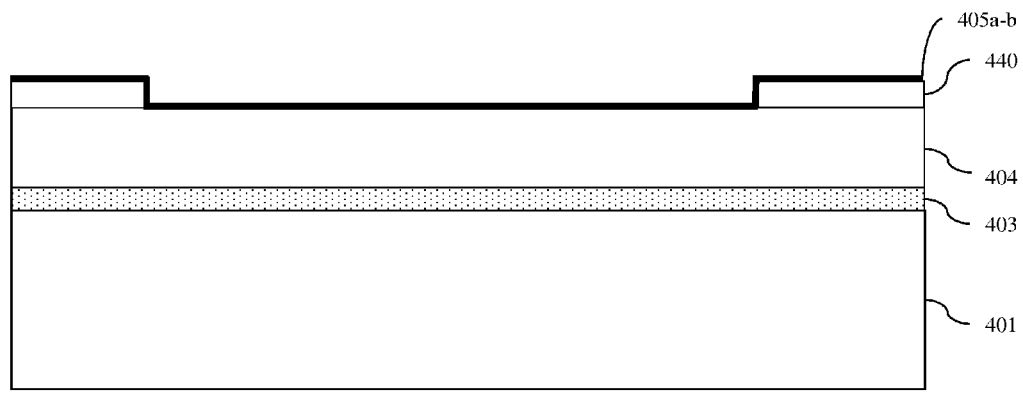
FIG. 18B is a cross-section diagram illustrating a partially completed integrated circuit structure formed according to the method of FIG. 16.

After the trench 450 and opening 455 are formed at process 510, a seed layer 405*b* can be formed (e.g., deposited by physical vapor deposition (PVD) on the second dielectric layer 440 such that it lines the trench 450 and opening 455 (514, see FIGS. 18A-18B). This seed layer 405*b* can comprise a conductive metal seed layer, such as, a copper seed layer. Optionally, prior to seed layer 405*b* formation at process 514, one or more conductive diffusion barrier layers 405*a* can be formed (e.g., by physical vapor deposition (PVD)) on the second dielectric layer 440 so as to line the trench 450 and opening 455 (512). Then, the seed layer 405*b* can be formed on the barrier layer(s) 405*a*.

Figure 19:
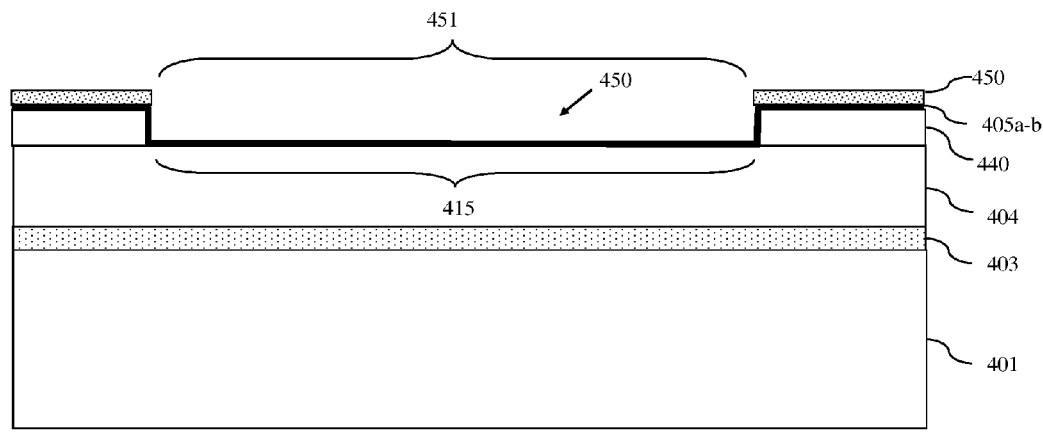
FIG. 19 is a cross-section diagram illustrating a partially completed integrated circuit structure formed according to the method of FIG. 16.

Once the seed layer 405*b* is formed at process 514, a patterned mask layer can be formed on the seed layer. This patterned mask layer 450 can specifically be formed with an opening 451 aligned above the trench 450 so that a first portion 415 of the seed layer 405*b* is exposed (516, see FIG. 19). Such a patterned mask layer 450 can be formed, for example, by patterning an organic layer (e.g., a polymer layer) and stamping it (i.e., transferring it) onto the seed layer 405*b*. Techniques for stamping or transferring patterned films (e.g., polymer films) onto a substrate are well-known in the art (e.g., see U.S. Pat. No. 6,966,997 Of Inganas et al. issued on Nov. 22, 2005 and incorporated herein by reference) and, thus, the details of such techniques are omitted from this specification to allow the reader to focus on the salient aspects of the invention.

Figure 20:
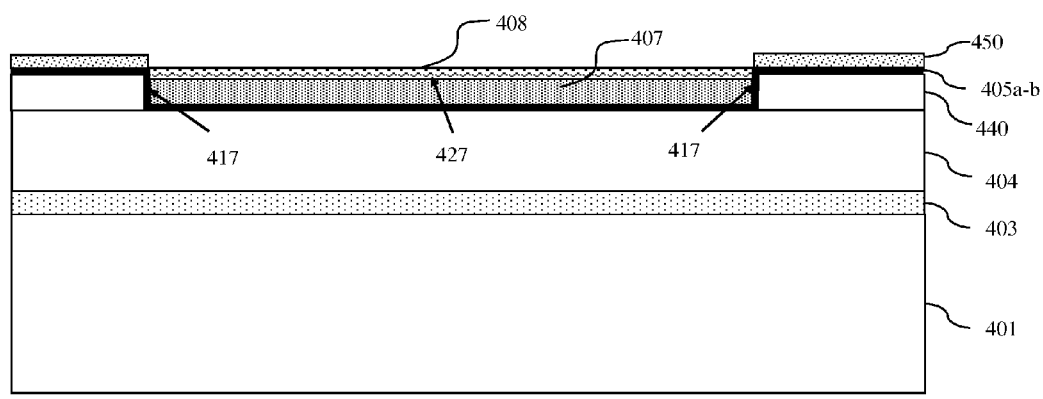
FIG. 20 is a cross-section diagram illustrating a partially completed integrated circuit structure formed according to the method of FIG. 16.

Next, a first metal layer 507 can be formed on the exposed first portion 415 of the seed layer 405*b* within the trench 450 (518, see FIG. 20). Specifically, the first metal layer can comprise, for example, a conductive metal layer (e.g., a copper (Cu) layer) selectively electroplated onto the exposed first portion 415 of the seed layer 405*b*. It should be noted that this first metal layer 507 will also simultaneously be formed within the opening 455, as shown in FIG. 18A, which extends vertically from the bottom surface of the trench 450 through the first dielectric layer(s) 403-404 to the conductive pad 402 and which is also lined with the seed layer 405*b*.

Then, a second metal layer 408 can be formed on the top surface 427 of the first metal layer 407 (520). This second metal layer 408 can comprise a different metal material than the first metal layer 407. This different metal material can be preselected so that it has a relatively slow etch rate when exposed to an etchant (e.g., a wet etchant) used, as discussed in detail below at process 524, to remove excess seed and barrier material and, thus, so that it protects the top surface 427 of the underlying first metal layer 107 during the process 524. It should be noted that the polyimide layer 440, within which the trench 450 is formed, provides sidewall passivation. That is, the polyimide layer 440 protects the sidewalls 417 of the first metal layer 407 during this same seed/barrier etch. This second metal layer 108 can comprise, for example, any of the following: a gold layer, a nickel layer, a cobalt layer, a nickel boride layer, a nickel phosphide layer, a cobalt boride layer and a cobalt phosphide layer. This second metal layer 108 can be selectively electroplated onto the first metal layer 107.

Once the second metal layer 408 is formed, the mask layer 450 can be removed so as to expose second portions 425 of the seed layer 405*b* (522, see FIG. 20). Specifically, removing the mask layer 450 exposes the portions 425 of the seed layer 405*b* remaining on the top surface of the second dielectric layer 440. Then, an etch process (e.g., a wet etch process) can be performed so as to remove these second portions 425 of the seed layer 405*b* as well as any barrier material that was below the second portions 425 of the seed layer 405*b* (524, see FIG. 21). As discussed above, during this etch process 524, the second metal layer 408 passivates the top surface of the first metal layer 407 and the second dielectric layer 440 passivates the sidewalls 417 of the first metal layer 407 such that dimensional control is maintained over the first metal layer 407 (i.e., such that the size of the first metal layer, as formed at process 518, remains essentially constant). Thus, in the method embodiment illustrated in FIG. 16, to ensure that the first metal layer 407 has a desired shape and size (e.g., area), the trench 450 is patterned at process 510 with the desired shape, although with a slightly larger size (e.g., covering a slightly larger area) taking into consideration the thickness of the barrier and seed layers 405*a-b* that will be formed at processes 212-214 so that the portion 415 of the seed layer 405*b* on to which the first metal layer 407 will be selectively electroplated at process 518 has the both the desired size and shape.

Next, a blanket third dielectric layer 406 (e.g., an additional polyimide layer) can be formed above the second metal layer 408 such that it extends laterally beyond the second metal layer 408 onto the second dielectric layer 440 (530, see FIG. 15A). This additional polyimide layer 406 can be formed, for example, by spin casting a polyamic acid solution onto the etch stop layer 103 and, then, performing a thermal curing process which produces the polyimide. Alternatively, this additional polyimide layer 406 can be formed by spin-on deposition and cure.

A second opening 456 (e.g., a solder resist opening) can then be formed such that it extends vertically through the third dielectric layer 406 to the second metal layer 408 (532). This second opening 456 can be offset from the opening 455 to the conductive pad 402 (e.g., at opposite ends of the metal layer 407). After the second opening 456 is formed, the second opening 456 can be lined with at least one ball limiting metallurgy layer 409 (534). These BLM layers 409 can comprise, for example, an adhesion layer (e.g., a chromium (Cr) layer, a titanium (Ti) layer, a titanium-tungsten (Ti—W) layer or any other suitable adhesion layer), a barrier layer (e.g., a nickel (Ni) layer, a nickel-copper (Ni—Cu) layer, a palladium (Pd) layer, a platinum (Pt) layer, a chromium-copper (Cr—Cu) layer or any other suitable layer for preventing electro-migration) on the adhesion layer and a bonding layer (e.g., a copper (Cu) layer, a gold (Au) layer or any other suitable bonding layer) on the barrier layer. Once the BLM layer(s) 409 are formed, a solder ball 410 can be formed on the uppermost ball limiting metallurgy layer 409 such that the solder ball 410 is electrically connected to the conductive pad 402 (536). The solder ball 410 can comprise any suitable solder material (e.g., tin, copper sliver, bismuth, indium, zinc, antimony, etc.). Techniques used for forming solder resist openings, for lining such openings with BLM layer(s) 409 and for forming solder balls 410 on BLM layers are well-known in the art. Thus, the details of such techniques are omitted from this specification in order to allow the reader to focus on the salient aspects of the invention.

For illustration purposes the above method embodiment is described with respect to the formation of a redistribution layer (i.e., the first metal layer 407 having sidewall passivation provided by the second dielectric layer 440 and top surface passivation provided by the second metal layer 408) that electrically connects a conductive pad 402 to an offset solder ball 410. It should, however, be understood that such a redistribution layer can, alternatively, be formed so that it electrically connects two or more essentially identical conductive pads formed at different locations on the surface of the substrate 401.

The method embodiments as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of an integrated circuit structure that incorporates a metal layer (e.g., a redistribution layer) with both top surface and sidewall passivation and a method of forming the integrated circuit structure. In one embodiment of the structure, top surface and sidewall passivation of a first metal layer can be provided by a second metal layer. To form such a structure, a first metal layer can be selectively electroplated onto an exposed portion of a seed layer at the bottom surface of a trench, which extends through a mask layer. Then, the sidewalls of the first metal layer within the trench can be exposed (e.g., either by removing spacers within the trench or by shrinking the mask layer). After the sidewalls of the first metal layer are exposed, a second metal layer different from the first can be selectively electroplated onto both the top surface and sidewalls of the first metal layer. In another embodiment of the structure, sidewall passivation of a first metal layer can be provided by a dielectric layer and top surface passivation of that same first metal layer can be provided by a second metal layer. To form such a structure, a trench can be formed in a dielectric layer. Then, a seed layer can be formed over the dielectric layer and lining the trench. Next, a mask layer can be with an opening aligned above the trench (e.g., by stamping on a patterned organic mask layer). Then, a first metal layer can be selectively electroplated onto the exposed portion of the seed layer within the trench and a second metal layer different from the first can be electroplated onto the top surface of the first metal layer. Top surface and sidewall passivation of the first metal layer ensures that the first metal layer is protected during subsequent processing (e.g., an etch process to remove excess seed material). Thus, the embodiments provide greater dimensional control and, thereby greater reliability.

What is claimed is:

1. A method of forming an integrated circuit structure incorporating a back end of the line (BEOL) redistribution layer with top surface and sidewall passivation provided by metal, said method comprising:
   forming a seed layer on a substrate;
   forming a mask layer on said seed layer;
   forming a trench extending through said mask layer to said seed layer and having first sidewalls;
   forming spacers within said trench on said seed layer and positioned laterally adjacent to said first sidewalls such that a first portion of said seed layer remains exposed;
   forming a first metal layer for said redistribution layer on said first portion of said seed layer;
   after said forming of said first metal layer, removing said spacers so as to expose second sidewalls of said first metal layer and second portions of said seed layer adjacent to said second sidewalls;
   forming, for said top surface and sidewall passivation of said redistribution layer, a second metal layer on said second portions of said seed layer, said second sidewalls of said first metal layer and on a top surface of said first metal layer, said second metal layer comprising a different metal material than said first metal layer and said forming of said second metal layer comprising performing a selective electroplating process;

removing said mask layer to expose third portions of said seed layer adjacent to said second portions; and performing an etch process to remove said third portions in order to complete said redistribution layer with said top surface and sidewall passivation; and forming a blanket polymide layer over said second metal layer and exposed portions of said substrate following removal of said third portions.

2. The method of claim 1, said forming of said seed layer comprising forming a copper seed layer by physical vapor deposition, and said forming of said first metal layer comprising electroplating a copper layer onto said copper seed layer.

3. The method of claim 1, said forming of said second metal layer comprising electroplating, onto said first metal layer, any of a gold layer, a nickel layer, a cobalt layer, a nickel boride layer, a nickel phosphide layer, a cobalt boride layer and a cobalt phosphide layer.

4. The method of claim 1, further comprising:

before said forming of said seed layer:

forming a conductive pad on said substrate;

forming a first dielectric layer on said substrate and said conductive pad;

forming an opening through said first dielectric layer to expose said conductive pad such that, after said forming of said seed layer, said seed layer lines said opening; and, after completing said redistribution layer with said top surface and sidewall passivation, forming a solder ball on said redistribution layer such that said redistribution layer electrically connects said solder ball to said conductive pad.

5. The method of claim 1, further comprising:

before said forming of said seed layer, forming a barrier layer, said forming of said seed layer comprising forming said seed layer on said barrier layer.

6. A method of forming an integrated circuit structure incorporating a back end of the line (BEOL) redistribution layer with top surface and sidewall passivation provided by metal, said method comprising:

forming a seed layer on a dielectric layer, said dielectric layer having discrete openings extending vertically to two conductive pads and said seed layer lining said openings;

forming a mask layer on said seed layer;

forming a trench extending through said mask layer to said seed layer and having first sidewalls;

forming spacers within said trench on said seed layer and positioned laterally adjacent to said first sidewalls such that a first portion of said seed layer remains exposed;

forming a first metal layer for said redistribution layer on said first portion of said seed layer;

after said forming of said first metal layer, removing said spacers so as to expose second sidewalls of said first metal layer and second portions of said seed layer adjacent to said second sidewalls;

forming, for said top surface and sidewall passivation of said redistribution layer, a second metal layer on said second portions of said seed layer, said second sidewalls of said first metal layer and on a top surface of said first metal layer, said second metal layer comprising a different metal material than said first metal layer and said forming of said second metal layer comprising forming said second metal layer by performing a selective electroplating process;

removing said mask layer to expose third portions of said seed layer adjacent to said second portions;

performing an etch process to remove said third portions in order to complete said redistribution layer with said top surface and sidewall passivation such that said redistribution layer electrically connects said two conductive pads; and forming a blanket polymide layer over said second metal layer and exposed portions of said dielectric layer following removal of said third portions.

7. The method of claim 6, said forming of said seed layer comprising forming a copper seed layer by physical vapor deposition, and said forming of said first metal layer comprising electroplating a copper layer onto said copper seed layer.

8. The method of claim 6, said forming of said second metal layer comprising electroplating, onto said first metal layer, any of a gold layer, a nickel layer, a cobalt layer, a nickel boride layer, a nickel phosphide layer, a cobalt boride layer and a cobalt phosphide layer.

9. The method of claim 6, further comprising:

before said forming of said seed layer, forming a barrier layer, said forming of said seed layer comprising forming said seed layer on said barrier layer.

* * * * *